United States Patent [19]

Shimizu et al.

[11] Patent Number: 4,468,443

[45] Date of Patent: Aug. 28, 1984

[54] PROCESS FOR PRODUCING PHOTOCONDUCTIVE MEMBER FROM GASEOUS SILICON COMPOUNDS

[75] Inventors: Isamu Shimizu, Yokohama; Kyosuke Ogawa; Eiichi Inoue, both of Tokyo; Junichiro Kanbe, Yokohama, all of Japan

[73] Assignee: Canon Kabushiki Kaisha, Tokyo, Japan

[21] Appl. No.: 354,898

[22] Filed: Mar. 4, 1982

[30] Foreign Application Priority Data

Mar. 12, 1981 [JP] Japan ................................. 56-36267
Mar. 16, 1981 [JP] Japan ................................. 56-37441
Mar. 16, 1981 [JP] Japan ................................. 56-37442
Apr. 21, 1981 [JP] Japan ................................. 56-60153
Apr. 21, 1981 [JP] Japan ................................. 56-60154
Apr. 21, 1981 [JP] Japan ................................. 56-60155
Apr. 21, 1981 [JP] Japan ................................. 56-60156
Apr. 21, 1981 [JP] Japan ................................. 56-60157
Apr. 21, 1981 [JP] Japan ................................. 56-60158

[51] Int. Cl.$^3$ ............................................ G03G 5/082
[52] U.S. Cl. ........................................ 430/60; 430/64; 430/84; 430/95; 430/128
[58] Field of Search ..................... 427/39; 430/64, 84, 430/90, 135, 128, 133, 60, 95

[56] References Cited

U.S. PATENT DOCUMENTS 4,217,374  8/1980  Ovshinsky et al. ................... 427/39
4,317,844  3/1982  Carlson ................................. 427/39
4,328,258  5/1982  Coleman ............................... 427/39
4,359,514  11/1982 Shimizu et al. ...................... 427/39

Primary Examiner—John E. Kittle
Assistant Examiner—John L. Goodrow
Attorney, Agent, or Firm—Fitzpatrick, Cella, Harper & Scinto

[57] ABSTRACT

A process for producing a photoconductive member, which comprises forming a photoconductive layer on a substrate for formation of a photoconductive layer by introducing starting substances for formation of a photoconductive layer under gaseous state into a deposition chamber maintained under a desired reduced pressure and exciting discharging under the gas atmosphere of said starting substances is characterized in that said starting substances are constituted of at least one substance selected from the first group consisting of substances(O) containing oxygen atoms as constituent atom, substances(N) containing nitrogen atoms as constituent atom and substances(C) containing carbon atoms as constituent atom, and at least two compounds selected from the second group consisting of the compounds of the formula:

$$Si_nH_{2n+2} \qquad (A)$$

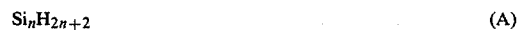

wherein n is a positive integer and the compounds of the formula:

$$Si_mH_lX_k \qquad (B)$$

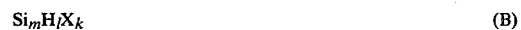

wherein m and k are positive integers, l is 0 or a positive integer, $l+k=2m+2$, and X represents a halogen atom, n and m being called "order number" hereinafter, and said at least two compounds selected from the second group consisting of the compounds represented by the formulas (A) and (B) to be introduced into said deposition chamber being controlled in amounts such that the proportion of the total of high order compounds is at least 1 vol. % based on the total of the minimum order compounds, the minimum order compound being one whose order number is the minimum among order numbers of said at least two compounds, the high order compound being one whose order number is higher than the order number of the minimum order compound.

20 Claims, 2 Drawing Figures

PROCESS FOR PRODUCING PHOTOCONDUCTIVE MEMBER FROM GASEOUS SILICON COMPOUNDS

BACKGROUND OF THE INVENTION

1. Field of the Invention

This invention relates to a process for producing a photoconductive member effective for formation of a photoconductive layer on a given substrate by utilization of discharging such as glow discharging, arc discharging, and the like.

2. Description of the Prior Arts

When it is desired to form a photoconductive layer having desirable characteristics on a given substrate by utilization of a plasma excited by glow discharging of a gaseous starting substance for formation of a photoconductive layer constituted of, for example, an amorphous material having a matrix of silicon atoms in a deposition chamber which can be reduced in pressure, particularly in case of a layer with a large area, it is very difficult to increase the layer formation rate, as compared with conventional vacuum deposition methods, while controlling the layer thickness uniformly over the whole area and also uniformly the physical characteristics such as electrical, optical and electrooptic characteristics as well as the quality of the product.

For example, when an amorphous silicon layer containing at least one of hydrogen atoms or halogen atoms(X) [hereinafter abbreviated as "a-Si(H, X)"] is intended to be formed on a substrate by decomposition of a gas such as $SiH_4$, $Si_2H_6$ or $SiF_4$ or a mixture of $SiH_4$ and $SiF_4$ using a discharging energy for utilization of electrical properties of the layer, the electrical properties of the layer are greatly dependent on the layer deposition rate and the temperature of the substrate at the time of formation of the layer. Therefore, for the purpose of obtaining uniform electrical properties and improved layer quality over the entire region of the layer, it is necessary to lower the layer deposition rate and elevate the substrate temperature.

On the other hand, for improvement of productivity and mass production capability, it may be desirable to increase the discharging power and the gas flow amount for increasing of the layer deposition rate. But, when discharging power and/or the gas flow amount is increased for increasing the layer deposition rate, the layer formed will significantly be lowered in electrical, optical and photoconductive characteristics and increased in the dependency of such characteristics on the sites of application, whereby it is very difficult under the present circumstances to form a layer of good quality. Thus, for the purpose of commercial production of a photoconductive member having a photoconductive layer constituted of an amorphous material containing a matrix of silicon atoms, it is necessary to improve the productivity and mass production capability, including reproducibility, while also retaining an excellent and uniform layer quality related intimately to photosensitivity, characteristics during repeated use, and the characteristics dependent on the environment during use.

SUMMARY OF THE INVENTION

The present invention has been accomplished in view of the above points and the object of the present invention is to provide a process for producing a photoconductive member which is excellent in productivity and mass production capability and also can easily provide a photoconductive layer excellent in various respects, including electrical, optical and photoconductive characteristics, layer quality as well as bulk density and filling characteristic of the layer.

It is also another object of the present invention to provide a process for producing a photoconductive member, by which there can be produced economically at high efficiency and high rate with good reproducibility a layer having substantially uniform physical characteristics and layer thickness over the whole region, even in case of a layer with a large area, which is also excellent in photoconductive and electrical characteristics under the conditions employed, especially under conditions of high humidity and high temperature.

According to the present invention, there is provided a process for producing a photoconductive member, which comprises forming a photoconductive layer on a substrate for formation of a photoconductive layer by introducing starting substances for formation of a photoconductive layer in the gaseous state into a deposition chamber maintained under a desired reduced pressure and exciting discharging in the the gas atmosphere of said starting substances, characterized in that said starting substances are constituted of at least one substance selected from a first group consisting of substances(O) containing oxygen atoms as constituent atom, substances(N) containing nitrogen atoms as constituent atom and substances(C) containing carbon atoms as constituent atom, and at least two compounds selected from a second group consisting of the compounds of the formula:

$$Si_nH_{2n+2} \qquad (A)$$

wherein n is a positive integer and the compounds of the formula:

$$Si_mH_lX_k \qquad (B)$$

wherein m and k are positive integers, l is 0 or a positive integer, $l+k=2m+2$, and X represents a halogen atom, n and m being called "order number" hereinafter, and said at least two compounds selected from the second group consisting of the compounds represented by the formulas (A) and (B) to be introduced into said deposition chamber being controlled in amounts such that the proportion of the total of high order compounds is at least 1 vol.% based on the total of the minimum order compounds. The minimum order compound being one whose order number is the minimum among order numbers of said at least two compounds, the high order compound being one whose order number is higher than the order number of the minimum order compound.

DETAILED DESCRIPTION OF THE PREFERRED EMBODIMENTS

Figures 1, 2:
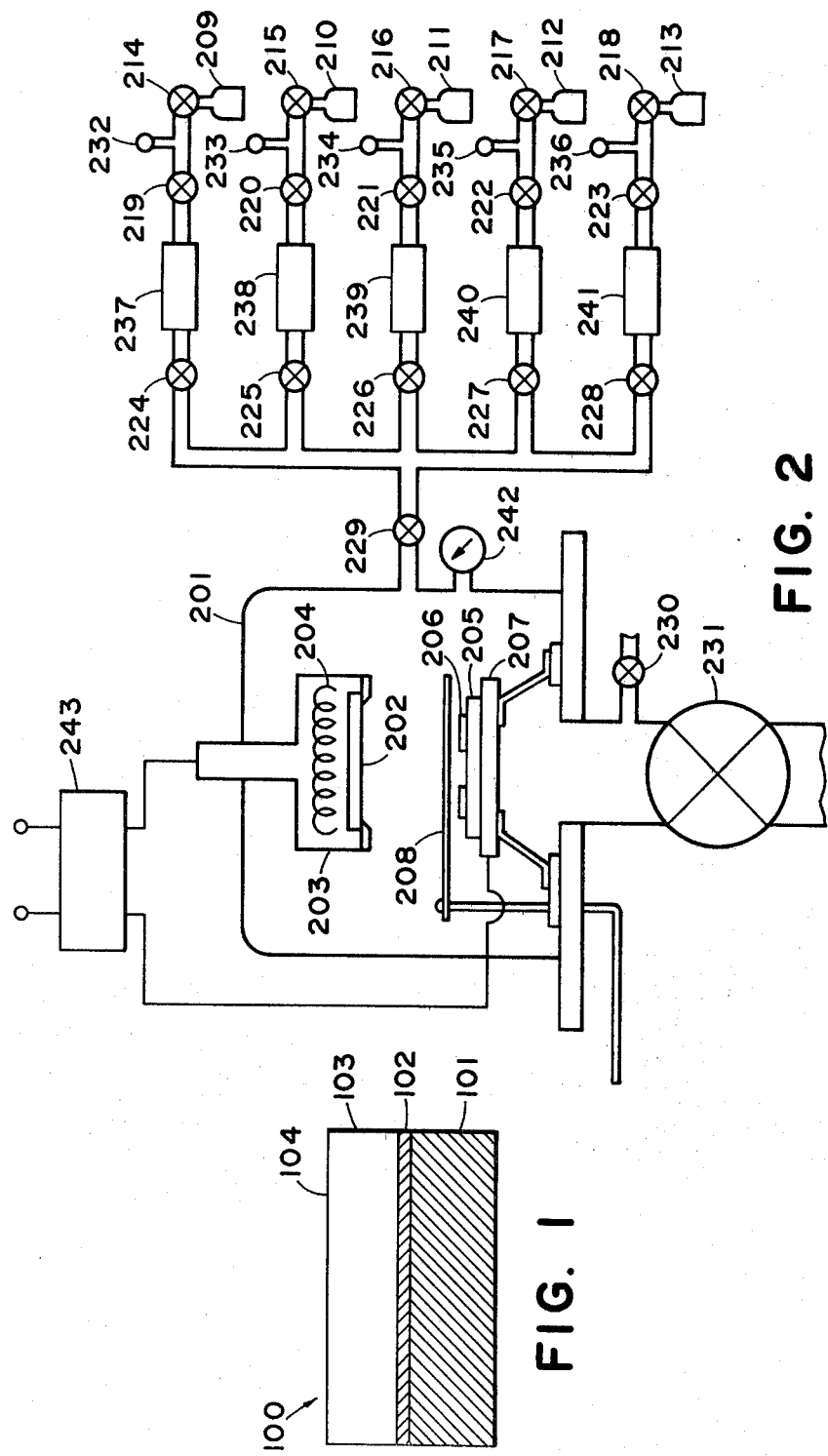
FIG. 1 shows a schematic illustration indicating the layer-structure of one embodiment of the photoconductive member prepared according to the process of the present invention.
FIG. 2 a schematic illustration indicating one example of a device to be used for practicing the process of the present invention.

The compounds represented by the formula (A) or (B) in the present invention are used as starting substances for the formation of Si as the constituent atom in the photoconductive layer to be prepared. More specifically, as the compounds represented by the formula (A), there may effectively be employed gaseous or gasifiable silanes such as $SiH_4$, $Si_2H_6$, $Si_3H_8$, $Si_4H_{10}$, $Si_5H_{12}$, $Si_6H_{14}$, $Si_7H_{16}$, $Si_8H_{18}$, etc.

As the compounds represented by the formula (B), there may effectively be employed $SiX_4$, $Si_2X_6$, $Si_3X_8$, $SiHX_3$, $SiH_2X_2$, $SiH_3X$ (where X is F, Cl, Br, I), as exemplified by $SiF_4$, $SiCl_4$, $SiBr_4$, $SiI_4$, $Si_2F_6$, $Si_2Cl_6$, $Si_2Br_6$, $Si_2I_6$, $Si_3F_8$, $Si_3Cl_8$, $SiHF_3$, $SiHCl_3$, $SiHBr_3$, $SiHI_3$, $SiH_2F_2$, $SiH_2Cl_2$, $SiH_3F$, $SiH_3Cl$, etc.

In the present invention, the starting substances for constitution of the photoconductive layer are so selected that there may be contained at least two members selected from the group consisting of compounds of the formula (A) and compounds of the formula (B). For example, said at least two members may be selected from compounds of the formula (A) only, or said at least two members may be selected from compounds of the formula (B) only. Said at least two members may consist of both at least one member of the formula (A) and at least one member of the formula (B).

The starting substances for constitution of the photoconductive layer in the present invention with a constitution as described above are introduced in gaseous state into a deposition chamber or alternatively respective substances constituting the starting materials are introduced under gaseous state into the deposition chamber so that they may assume the constitution as mentioned above upon introduction into the deposition chamber.

Any one of the substance containing oxygen atoms, (O), the substance containing nitrogen atoms as constituent atoms, (N), or the substance containing carbon atoms as constituent atoms, (C), each of which is another substance constituting the starting substances for formation of the photoconductive layer may be introduced into the above deposition chamber together with or separately from the compounds of the formula (A) or the formula (B).

In the present invention, formation of a photoconductive layer on a substrate is effected by excitation of discharging such as glow discharge or arc discharge in a gas atmosphere of the starting materials constituted of the respective substances as described above.

In the following description, n and m are called "order number". A minimum order compound is one whose order number is the minimum among order numbers of the compounds represented by formulas (A) and (B). A high order compound is one whose order number is higher than the order number of the minimum order compounds.

When the starting substances in the present invention are constituted of at least two compounds selected from the compounds represented by formula (A), among selected compounds, $Si_2H_6$, $Si_3H_8$ and $Si_4H_{10}$ are preferable to constitute a group of high order compounds with higher orders of n. They may be employed as a mixture. Alternatively, at least one of them is used as a principal component in combination with other compounds with n of 5 or more so as to constitute a group of high order compounds with higher order of n.

In particular, a mixed system wherein either one or both of $Si_3H_8$ or $Si_4H_{10}$ constituting a group of high order compounds with higher orders of n is used as the principal components in combination with $Si_2H_6$ as the compound with the minimum order of n is preferred.

Next to such mixed system, it is also preferred to use a mixed system wherein $SiH_4$ is employed in place of $Si_2H_6$ as the minimum order compound with the minimum order of n and at least one of $Si_2H_6$, $Si_3H_8$ and $Si_4H_{10}$ constituting the group of high order compounds with higher n orders are selected as the principal component.

When the starting substances in the present invention are constituted of at least two compounds selected from the compounds represented by formula (B), among selected compounds, $Si_2F_6$, $Si_2Cl_6$, $Si_2Br_6$ and $Si_3F_8$ are preferable to constitute a group of high order compounds with higher orders of m. They may be employed as a mixture. Alternatively, at least one of them can be used as a principal component in combination with other compounds with higher orders of m so as to constitute a mixture of high order compounds with higher orders of m.

In particular, a mixed system wherein either one, two or all of $Si_2F_6$, $Si_2Cl_6$ and $Si_2Br_6$ constituting a group of high order compounds with higher orders of m is used as the principal components and $SiF_4$ or $SiCl_4$ as the compound with the minimum order of m is preferred.

In the present invention, as one species constituting the starting substances for formation of the photoconductive layer, at least one kind is selected from the compounds of the formula (A) or (B) and at least two kinds are selected from the other. Alternatively, said one species consists of at least one of compounds of the formula (A) and at least one of compounds of the formula (B). These selected compounds are introduced into a deposition chamber at a ratio such that the proportion of the high compounds having higher than order of either n or m the compound with the minimum value of either n or m may generally be 1 vol.% or more relative to said minimum order compound with the minimum order. The electric discharge is conducted in a mixed gas atmosphere of such constitution thereby for the photoconductive layer. The aforesaid proportion should more preferably be at least 5 vol.%, and optimumly 10 vol.% or more.

The upper limit of the aforesaid proportion, which may most appropriately be determined depending on the compounds employed for constitution of the mixed system, is generally 99 vol.%, preferably 97 vol.%.

In the present invention, the substance containing oxygen atoms as constituent atoms, (O), which is one of the starting substances of the present invention for formation of the photoconductive layer, is used for incorporation of oxygen atoms in the photoconductive layer formed. It is desired to be generally in a gaseous state or to be readily gasifiable for the purpose of the invention. As the substance for starting gasses for incorporation of oxygen atoms to be effectively used in the present invention, there may be mentioned oxygen($O_2$), ozone($O_3$), and also lower siloxanes containing Si, O and H as constituent atoms such as disiloxane $H_3SiOSiH_3$ or trisiloxane $H_3SiOSiH_2OSiH_3$. In particular, oxygen($O_2$) is useful.

In the present invention, the substance containing nitrogen atoms as constituent atoms, (N), which is one of the starting substances of the present invention for formation of the photoconductive layer, is a starting substance for incorporation of nitrogen atoms in the photoconductive layer formed. For convenience in production as well as from standpoint of transporting the starting substances, it is desired that they be introduced into a deposition chamber for formation of the photoconductive layer in a gaseous state. For this reason, there may generally be employed those substances which are gaseous under conditions of normal temperature and normal pressure or at least readily gasifiable under layer forming conditions.

As the starting substances to be employed effectively for incorporation of nitrogen atoms, there may be employed gaseous or gasifiable nitrogen, nitrogen compounds such as nitrides or azides containing N or N and H as constituent atoms, as exemplified by nitrogen($N_2$), ammonia($NH_3$), hydrazine($H_2NNH_2$), hydrogen azide($HN_3$), ammonia azide($NH_4N_3$).

Other than those mentioned above, for the purpose of incorporating halogen atoms(X) exhibiting a similar effect to that of hydrogen atoms(H) in addition to incorporation of nitrogen atoms, it is also possible to use nitrogen halide compounds such as nitrogen trifluoride($F_3N$), nitrogen tetrafluoride($F_4N_2$), etc.

Further, in addition to those mentioned above, there may also be employed as effective starting substance in the present invention nitrogen monoxide(NO), nitrogen dioxide($NO_2$), dinitrogen monoxide($N_2O$), dinitrogen trioxide($N_2O_3$), dinitrogen tetraoxide($N_2O_4$), dinitrogen pentaoxide($N_2O_5$), nitrogen trioxide($NO_3$), and the like.

In the present invention, the substance containing carbon atoms as constituent atoms, (C), which is one of the starting substances of the present invention for formation of the photoconductive layer is a starting substance for incorporation of carbon atoms in the photoconductive layer formed. For convenience in production as well as from the standpoint of transporting the starting substances, it is desired that they be introduced into a deposition chamber for formation of the photoconductive layer in the gaseous state. For this reason, there may generally be employed those substance which are gaseous under conditions of normal temperature and normal pressure or at least readily gasifiable under layer forming conditions.

In the present invention, as the starting substances effectively used for incorporation of carbon atoms, there may be mentioned, for example, saturated hydrocarbons having 1 to 5 carbon atoms, ethylenic hydrocarbons having 2 to 5 carbon atoms and acetylenic hydrocarbons having 2 to 4 carbon atoms containing C and H as constituent atoms.

More specifically, there may be included saturated hydrocarbons such as methane($CH_4$), ethane($C_2H_6$), propane ($C_3H_8$), n-butane(n-$C_4H_{10}$), pentane($C_5H_{12}$), ethylenic hydrocarbons such as ethylene($C_2H_4$), propylene($C_3H_6$), butene-1($C_4H_8$), butene-2($C_4H_8$), isobutylene($C_4H_8$), pentene ($C_5H_{10}$), acetylenic hydrocarbons such as acetylene($C_2H_2$), methyl acetylene($C_3H_4$), butylene($C_4H_6$), etc.

As starting gases containing Si, C and H as constituent atoms, there may be mentioned alkyl silanes such as Si($CH_3$)$_4$, Si($C_2H_5$)$_4$, etc.

Other than those mentioned above, there may also effectively be employed halogen-substituted paraffinic hydrocarbons such as $CCl_4$, $CHF_3$, $CH_2F_2$, $CH_3F$, $CH_3Cl$, $CH_3Br$, $CH_3I$, $C_2H_5Cl$, etc. and silane derivatives such as halogen-containing alkyl silanes as exemplified by SiCl($CH_3$)$_3$, $SiCl_2$($CH_3$)$_2$, $SiCl_3CH_3$, etc. Alternatively, it is also possible to use carbon monoxide(CO) or carbon dioxide($CO_2$) as an effective starting substance.

In the present invention, when a substance containing oxygen atoms is to be introduced into a deposition chamber, the ratio of the substance containing oxygen atoms based on the total volume of the compounds represented by the formula (A) and (B) is generally 8 vol.% or less, preferably 6 vol.% or less, most preferably 1 vol.% or less.

On the other hand, in the present invention, when a substance containing nitrogen atoms is to be introduced into a deposition chamber, the ratio of the substance containing nitrogen atoms based on the total volume of the compounds represented by the formula (A) and (B) is generally 50 vol.% or less, preferably 30 vol.% or less, most preferably 8 vol.% or less.

When a substance containing carbon atoms is to be introduced into a deposition chamber, the ratio of the substance containing carbon atoms to the total volume of the compounds represented by the formula (A) and (B) is generally 15 vol.% or less, preferably 8 vol.% or less, most preferably 5 vol.% or less.

In the present invention, when at least two compounds selected from the compounds represented by the above formulas are introduced into a deposition chamber, they may previously be mixed at a ratio as specified above before introduction into the chamber or alternatively they may separately be introduced into the chamber in amounts corresponding to such ratio.

Typical examples of combinations of two or more kinds of compounds selected from those represented by the above formula (A) and/or (B) are listed in Tables 1, 2 and 3.

In Tables 1 and 2, there are shown examples when at least two kinds of compounds are selected from those represented by the formula (A) or further at least one compound from those represented by the formula (B) in addition thereto.

In these exemplary combinations, compounds represented by the formula (B) preferably employed are $SiF_4$ and $SiCl_4$ as the compound with the minimum order of m, and $Si_2Cl_6$, $Si_2Br_6$ and $Si_3F_8$ as the compound with higher order of m. As a preferable partner substance containing oxygen atoms, oxygen($O_2$) is used, while methane($CH_4$), ethylene($C_2H_4$) and propane($C_3H_8$) as preferable partner substances containing carbon atoms and nitrogen gas($N_2$) and ammonia gas($NH_3$) as preferable partner substances containing nitrogen atoms are used.

Table 3 shows examples when at least two kinds of compounds are selected from those represented by the formula (B) or at least one kind of compound selected from those represented by the formula (A) in addition thereto.

In these exemplary combinations, preferable compounds represented by the formula (A) are $SiH_4$ and $Si_2H_6$ as the compound with the minimum order of n, and compounds with n of 2 or more, particularly 2, 3, 4 and 5 as high order compounds with higher orders of n.

In examples of combinations shown in Tables 1 and 2, more preferable ones are those of 1 to 27, particularly 17 to 27, in which more marked effects are exhibited.

In examples of combinations shown in Table 3, more preferable ones are those of A1 to A10, especially A1 to A3 and A5 to A8, in which more marked effects are exhibited.

In examples shown in Tables 1 to 3, there are shown examples in which at least two kinds of compounds are selected from either one of the group of compounds represented by the formula (A) or the group of compounds represented by the formula (B). It is also possible in the present invention to select a compound from the group of compounds represented by the formula (A)

and another compound from the group of compounds represented by the formula (B), for example, $SiH_4$ and $Si_2F_6$, $SiF_4$ and $Si_2H_6$, $SiHF_3$ and $Si_2H_6$, $SiF_4$ and $Si_3H_8$, and the like.

conductive layer formed as constituent element, which are gaseous or readily gasifiable.

In the process for production of photoconductive members according to the present invention, it is possible to effect layer formation at far higher rates and more economically and also by increasing the substrate temperature and discharging power, as compared with the methods of prior art, provided that photoconductive layers of the same characteristics and layer quality are to be produced.

For example, when a photoconductive layer having the characteristics and the layer quality for accomplishing the object of the present invention is to be obtained, the substrate temperature can be 150° C. or higher and the discharging power 100 W or higher.

Referring now to a typical example of a photoconductive member to be produced according to the process of the present invention, the present invention is described in further detail.

FIG. 1 shows a schematic sectional view for illustration of a typical example of the photoconductive member prepared according to the present invention.

The photoconductive member 100 shown in FIG. 1 is an embodiment applicable for electrophotography or an image pickup device, comprising a substrate 101 for photoconductive member, and intermediate layer 102 which may optionally be provided on said substrate,

TABLE 1

| Examples of combinations: | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|
| Number of n | | | | | | | | | | | | | | | | | | | | | | | | | | | |
| 1 | ◎ | ◎ | ◎ | ◎ | ◎ | ◎ | ◎ | ◎ | ◎ | ◎ | ◎ | ◎ | ◎ | ◎ | ◎ | ◎ | | | | | | | | | | | |
| 2 | ◎ | | | | | | ◎ | ◎ | ◎ | | | | ◎ | ◎ | ◎ | | ◎ | ◎ | ◎ | ◎ | ◎ | ◎ | ◎ | | | | |
| 3 | | | ◎ | | | ◎ | | | | ◎ | ◎ | | ◎ | ◎ | | ◎ | ◎ | ◎ | | | ◎ | ◎ | | ◎ | ◎ | ◎ | |
| 4 | | | | ◎ | | | | ◎ | | ◎ | | ◎ | | ◎ | ◎ | ◎ | | ◎ | ◎ | | ◎ | | ◎ | ◎ | ◎ | | ◎ |
| 5 | | | | | ◎ | | | | ◎ | | ◎ | ◎ | | | ◎ | ◎ | | | | ◎ | | ◎ | ◎ | | ◎ | ◎ | ◎ |

TABLE 2

| Examples of combinations: | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 |
|---|---|---|---|---|---|---|---|---|---|---|---|---|---|---|---|---|---|---|---|---|---|---|---|---|---|---|---|
| Number of n | | | | | | | | | | | | | | | | | | | | | | | | | | | |
| 1 | ◎ | ◎ | ◎ | ◎ | ◎ | ◎ | ◎ | ◎ | ◎ | ◎ | ◎ | ◎ | ◎ | ◎ | ◎ | ◎ | | | | | | | | | | | |
| 2 | ◎ | | | | | | ◎ | ◎ | ◎ | | | | ◎ | ◎ | ◎ | | ◎ | ◎ | ◎ | ◎ | ◎ | ◎ | ◎ | | | | |
| 3 | | | ◎ | | | ◎ | | | | ◎ | ◎ | | ◎ | ◎ | | ◎ | ◎ | ◎ | | | ◎ | ◎ | | ◎ | ◎ | ◎ | |
| 4 | | | | ◎ | | | | ◎ | | ◎ | | ◎ | | ◎ | ◎ | ◎ | | ◎ | ◎ | | ◎ | | ◎ | ◎ | ◎ | | ◎ |
| 5 | | | | | ◎ | | | | ◎ | | ◎ | ◎ | | | ◎ | ◎ | | | | ◎ | | ◎ | ◎ | | ◎ | ◎ | ◎ |
| 6 | ◎ | ◎ | ◎ | ◎ | ◎ | ◎ | | | ◎ | ◎ | ◎ | ◎ | | | ◎ | ◎ | ◎ | ◎ | ◎ | ◎ | ◎ | ◎ | ◎ | ◎ | ◎ | ◎ | ◎ |
| 7 | | | | | | | ◎ | | ◎ | | | | ◎ | | ◎ | | | | | | ◎ | ◎ | | | | | |
| 8 | | | | | | | | ◎ | | | | | | ◎ | | | | | | | | | | | | | |

TABLE 3

| Examples of combinations: | A1 | A2 | A3 | A4 | A5 | A6 | A7 | A8 | A9 | A10 | A11 | A12 | A13 | A14 | A15 | A16 | A17 |
|---|---|---|---|---|---|---|---|---|---|---|---|---|---|---|---|---|---|
| Compounds | | | | | | | | | | | | | | | | | |
| $SiF_4$ | ◎ | | | ◎ | ◎ | | | | ◎ | | | ◎ | ◎ | ◎ | ◎ | | |
| $SiCl_4$ | | ◎ | | | | | | | | | | | | | | ◎ | |
| $SiBr_4$ | | | ◎ | | | | | | | | | | | | | | ◎ |
| $SiHF_3$ | | | | | | ◎ | ◎ | | | ◎ | | | | | ◎ | | |
| $SiHCl_3$ | | | | | | | | ◎ | | | | | | | | ◎ | |
| $SiHBr_3$ | | | | | | | | | ◎ | | | | | | | | ◎ |
| $SiHI_3$ | | | | | | | | | | | | | ◎ | ◎ | | | |
| $SiH_3F$ | | | | | | | | | | | ◎ | ◎ | | | | | |
| $SiH_3Cl$ | | | | | | | | ◎ | | | | | | | | | |
| $Si_2F_6$ | ◎ | | | ◎ | ◎ | ◎ | | | ◎ | ◎ | ◎ | ◎ | | ◎ | | | |
| $Si_2Cl_6$ | | ◎ | | | | | ◎ | | | | | | ◎ | | ◎ | | |
| $Si_2Br_6$ | | | ◎ | | | ◎ | | ◎ | | | | | | | | | |
| $Si_3F_8$ | | | | ◎ | ◎ | | ◎ | | | | | | | | ◎ | | |

In the present invention, the mixed gas system of the starting substances may be used as a mixture with an atmospheric gas or other starting gas for layer formation in order to obtain a desired concentration or a gas pressure in a deposition chamber for formation of a photoconductive layer.

As an atmospheric gas to be used in the present invention, there is adopted a gas having no deleterious effect on the photoconductive layer formed, namely a gas constituted of atoms which is one constituent of said layer and which gas is entirely inert.

As substances which can be such atmospheric gases, there may be listed rare gases such as He, Ne, Ar, etc., halogenic gases such as fluorine, chlorine, bromine or iodine, gaseous or gasifiable interhalogen compounds such as BrF, ClF, $ClF_3$, $BrF_5$, $BrF_3$, $IF_7$, $IF_5$, ICl, IBr, etc., hydrogen halide gases such as HF, HCl, HBr, etc and $H_2$.

Among these substances for atmospheric gas, rare gases and $H_2$ gas can be particularly effective when employed. As starting gases for formation of layers, there may be mentioned substances containing impurity atoms which control the conduction type of the photoand a photoconductive layer 103 provided according to the process of the present invention.

The substrate 101 may be either electroconductive or insulating. As the electroconductive material, there may be mentioned metals such as NiCr, stainless steel, Al, Cr, Mo, Au, Ir, Nb, Ta, V, Ti, Pt, Pd, etc. or alloys thereof.

As insulating substrates, there may conventionally be used films or sheets of synthetic resins, including polyesters, polyethylene, polycarbonates, cellulose acetate, polypropylene, polyvinyl chloride, polyvinylidene chloride, polystyrene, polyamides, etc., glasses, ceramics, papers and the like. These insulating substrates may suitably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electronbeam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the photoconductive member 100 in FIG. 1 is to be used as an image-forming member for electrophotography, it may desirably be formed into an endless belt or a cylinder for use in continuous high speed copying.

The intermediate layer 102 is constituted of a matrix of, for example, silicon atoms, and carbon atoms, nitrogen atoms or oxygen atoms, containing optionally hydrogen atoms or halogen atoms(X), thus being constituted of an amorphous material which is non-photoconductive at least in the visible light region, and has the function of so-called barrier which can effectively bar injection of carriers from the side of the substrate 101 into the photoconductive layer 103, while permitting photocarriers generated in the photoconductive layer 103 by irradiation of an electromagnetic wave and migrating toward the side of the substrate 101 to be passed from the side of the photoconductive layer 103 to the side of the substrate 101.

For formation of an intermediate layer 102, the glow discharge method can be employed since it enables continuous operation including formation of the photoconductive layer 103. In such a case, a starting gas for formation of the intermediate layer, optionally admixed with a diluting gas such as He, Ar, etc. at a predetermined ratio, is introduced into a deposition chamber for vacuum deposition in which the substrate 101 is placed, wherein gas plasma is formed by excitation of glow discharging in the atmosphere of the gas introduced thereby to form the intermediate layer 102 on said substrate 101.

Starting substances effectively used as the starting gases for formation of the intermediate layer 102 may include hydrogenated silicon containing Si and H as constituent atoms such as silanes as exemplified by $SiH_4$, $Si_2H_6$, $Si_3H_8$, $Si_4H_{10}$, etc.; gaseous or gasifiable nitrogen, nitrogen compounds such as nitrides or azides containing N or N and H as constituent atoms, as exemplified by nitrogen($N_2$), ammonia($NH_3$), hydrazine ($H_2NNH_2$), hydrogen azide($HN_3$), ammonia azide($NH_4N_3$); compounds containing C and H as constituent atoms such as saturated hydrocarbons having 1 to 5 carbon atoms, ethylenic hydrocarbons having 2 to 5 carbon atoms and acetylenic hydrocarbons having 2 to 4 carbon atoms, more specifically, including saturated hydrocarbons such as methane($CH_4$), ethane($C_2H_6$), propane ($C_3H_8$), n-butane(n-$C_4H_{10}$), pentane($C_5H_{12}$), ethylenic hydrocarbons such as ethylene($C_2H_4$), propylene($C_3H_6$), butene-1($C_4H_8$), butene-2($C_4H_8$), isobutylene($C_4H_8$), pentene($C_5H_{10}$), acetylenic hydrocarbons such as acetylene($C_2H_2$), methyl acetylene($C_3H_4$), butyne($C_4H_6$), etc.; and further oxygen($O_2$), ozone($O_3$), carbon monoxide(CO), carbon dioxide($CO_2$), nitrogen monoxide(NO), nitrogen dioxide($NO_2$), dinitrogen monoxide ($N_2O$), etc.

These starting substances for formation of the intermediate layer 102 are suitably selected in formation of the layer so that the desired atoms may be incorporated as constituent atoms in the intermediate layer 102 formed.

As substances other than those mentioned above for constitution of the intermediate layer 102, there may also be employed electrically insulating metal oxides.

As electrically insulating metal oxides for constitution of the intermediate layer 102, there may preferably be employed $TiO_2$, $Ce_2O_3$, $ZrO_2$, $HfO_2$, $GeO_2$, CaO, BeO, $P_2O_5$, $Y_2O_3$, $Cr_2O_3$, $Al_2O_3$, MgO, $MgO \cdot Al_2O_3$, $SiO_2 \cdot MgO$. These materials may be used as a combination of two or more kinds for formation of the intermediate layer 102.

Further, the aluminum layer 102 may also be provided on a substrate 101 which is made of aluminum or an aluminum alloy by subjecting the surface of such aluminum substrate or an aluminum alloy substrate to alumite or boemite treatment.

The intermediate layer 102 may have a thickness of generally in the range from 30 Å to 2μ, preferably from 30 to 1000 Å, most preferably 50 to 600 Å.

The photoconductive layer 103 may be constituted of a-Si(H,X) having the semiconductor characteristics as shown below:

(1) p-type a-Si(H,X) . . . containing only acceptor, or containing both donor and acceptor with higher concentration of acceptor(Na);

(2) n-type a-Si(H,X) . . . containing only donor, or containing both donor and acceptor with higher concentration of donor(Nd);

(3) i-type a-Si(H,X) . . . Na≃Nd≃0 or Na≃Nd.

The photoconductive layer 103 may have a thickness which may suitably be determined depending on the intended uses such as reading device, solid state pickup device, image-forming member for electrophotography, etc.

The photoconductive layer 103 has a thickness which is suitably determined as desired depending on the thickness of the intermediate layer so that both functions of the photoconductive layer 103 and the intermediate layer 102 may be fulfilled, and is generally some hundred to some thousand times as thick as the thickness of the intermediate layer 102.

More specifically, the thickness is desired to be generally in the range of from 1 to 100μ, preferably from 2 to 50μ.

The content of H or X or (H+X) when both H and X are contained is desired to be generally in the range of from 1 to 40 atomic %, preferably 5 to 30 atomic %.

In order to make the photoconductive layer 103 n-type or p-type, it can be accomplished by adding impurities which control the conduction type, namely n-type impurity, p-type impurity or both impurities while controlling their amounts during formation of the layer. As impurities to be added into the photoconductive layer, there may preferably be employed as a p-type impurity an element in the group III A of the periodic Table such as B, Al, Ga, In, Tl, etc. or as a n-type impurity an element in the group V A of the periodic Table such as N, P, As, Sb, Bi, etc. Among them, B, Ga, P, Sb and the like are especially preferred.

In the present invention, in order to prepare a photoconductive layer having a desired conduction type, the content of an impurity to be added into the photoconductive layer may suitably be determined depending on the electrical as well as optical characteristics desired, but may be in the range of $3 \times 10^{-2}$ atomic % or less in case of the impurity in the group III A of the periodic Table, while it may be in the range of $5 \times 10^{-3}$ atomic % or less in case of the impurity in the group V A of the periodic Table.

For addition of an impurity into the photoconductive layer 103, a starting substance for incorporation of an impurity may be introduced into the deposition chamber together with the principal starting substance for formation of the photoconductive layer 103 when forming the layer. As starting substances for incorporation of such impurities, there may be employed those which are gaseous under normal temperature and normal pressure or readily gasifiable at least under the layer forming conditions. Specific examples of such starting substances for incorporation of impurities may include, for example, $PH_3$, $P_2H_4$, $PF_3$, $PF_5$, $PCl_3$, $AsH_3$, $AsF_3$, $AsF_5$, $AsCl_3$, $SbH_3$, $SbF_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc.

As described above, according to the process for preparation of the photoconductive member of the present invention, there can be prepared economically and easily a photoconductive member with a large area which is markedly more excellent in physical characteristics, optical characteristics, electrical characteristics and electrooptic characteristics at higher efficiency and higher rate than the processes of the prior art with additional advantages of increased density of the layer itself, higher filling degree of the layer, excellent performance under highly humid and high temperature environments as well as uniformity of such characteristics and uniform thickness over the entire region of the film.

In particular, the photoconductive member prepared according to the process of the present invention can be made avail of its characteristics to full extent when applied for electrophotography.

EXAMPLE 1

Using a device as shown in FIG. 2 placed in a clean room which has been completely shielded, a photoconductive member for electrophotography was prepared according to the following procedures.

A molybdenum substrate 202 of 10 cm square having a thickness of 0.5 mm, whose surface had been cleaned, was fixed firmly on a fixing member 203 disposed at a predetermined position in a deposition chamber 201. The targets 205, 206 employed were constituted of a high purity polycrystalline silicon (99.999%) provided on a high purity graphite (99.999%), with an area ratio of silicon to graphite being 1:9. The substrate 202 was heated by a heater 204 within the fixing member 203 with a precision of $\pm 0.5°$ C. The temperature was measured directly at the backside of the substrate by an alumel-chromel thermocouple. Then, after confirming that all the valves in the system were closed, the main valve 231 was opened fully to evacuate once to about $5 \times 10^{-7}$ Torr (during this operation all the valves in the system were closed). Subsequently, the auxiliary valve 229, and then the outflow valves 224, 225, 227, 228 were opened to remove sufficiently the gases in the flowmeters 237, 238, 240 and 241. Then, the outflow valves 224, 225, 227 and 228, and the auxiliary valve 229 were closed. The valve 218 of the bomb 213 containing Ar gas (purity: 99.999%) was opened to adjust the pressure at the outlet pressure gage 236 at 1 kg/cm$^2$, whereupon the inflow valve 223 was opened, followed by gradual opening of the outflow valve 228 to introduce Ar gas into the deposition chamber 201. The outflow valve 228 was gradually opened until the indication on the Pirani gage 242 became $5 \times 10^{-4}$ Torr. After the flow amount was stabilized under this state, the main valve 231 was gradually closed to narrow the opening until the pressure in the chamber became $1 \times 10^{-2}$ Torr. After confirming that the flowmeter 241 was stabilized, with the shutter 208 being opened, and then the high frequency power source 243 was turned on to input an alternate current of 13.56 MHz, 100 W between the targets 205, 206 and the fixing member 203. A layer was formed while taking matching so as to continue stable discharging under these conditions. After discharging was continued under these conditions for one minute, an intermediate layer with a thickness of 100 Å was formed. Then, the high frequency power source 243 was turned off for intermission of glow discharging. Subsequently, the outlfow valve 228 and the inflow valve 223 were closed and the main valve 231 fully opened to discharge the gas in the deposition chamber 201 until it was evacuated to $5 \times 10^{-7}$ Torr. Then, the input voltage at the heater 204 was changed by elevating the input voltage while detecting the substrate temperature, until it was stabilized constantly at 300° C.

Then, after the auxiliary valve 229, then the outflow valve 228 were fully opened to degas sufficiently the flowmeter 241 to vacuo. After the auxiliary valve 229 and the outflow valve 228 were closed, the valve 214 of the bomb 209 of $Si_2H_6$ gas (purity: 99.999%) containing 10 vol.ppm of $B_2H_6$ gas [hereinafter abridged as "$B_2H_6(10)/Si_2H_6$"], the valve 217 of the bomb 212 of $NO_2$ gas (purity: 99.999%) and the valve 215 of the bomb 210 of $SiH_4$ gas (purity: 99.999%) were respectively opened to adjust the pressures at the outlet pressure gages 232, 233 and 235, respectively, to 1 kg/cm$^2$, whereupon the inflow valves 219, 220, 222, 223 were gradually opened to introduce $B_2H_6(10)/Si_2H_6$ gas, $SiH_4$ gas, $NO_2$ gas and Ar gas into the flowmeters 237, 238, 240 and 241, respectively. Subsequently, the outflow valves 224, 225, 227, 228 were gradually opened, followed by opening of the auxiliary valve 229. The inflow valves 219, 220 and 223 were adjusted thereby so that the flow amount ratio of $B_2H_6(10)/Si_2H_6$:$SiH_4$:Ar was 30:1:69 and that the flow amount of $NO_2$ gas was 0.1 vol.% of the total flow amount of $B_2H_6(10)/Si_2H_6$ gas and $SiH_4$ gas. Then, while carefully reading the Pirani gage 242, the opening of the auxiliary valve 229 was adjusted and it was opened to the extent until the inner pressure in the chamber 201 became $1 \times 10^{-2}$ Torr. After the inner pressure in the chamber 201 was stabilized, the main valve 231 was gradually closed to narrow its opening until the indication on the Pirani gage 242 became 0.2 Torr. After confirming that the gas feeding and the inner pressure were stable, the shutter 208 (which was also an electrode) was closed and then the switch of high frequency power source 243 was turned on to input a high frequency power of 13.56 MHz between the electrode 203 and the shutter 208, thereby generating glow discharge in the chamber 201 to provide an input power of 100 W. After glow discharging was continued for one hour to form a photoconductive layer, the heater 204 was turned off, with the high frequency power source 243 being also turned off, and the substrate was left to cool to 100° C., whereupon the outflow valves 224, 225, 227, 228 and the inflow valves 219, 220, 222, 223 were closed, with the main valve 231 fully opened, thereby to make the inner pressure in the chamber 201 to less than $10^{-5}$ Torr. Then, the inner pressure in the chamber 201 was made atmospheric through the leak valve 230, and the substrate was taken out. In this case, the entire thickness of the layers formed was about 18μ.

The thus prepared photoconductive member was placed in an experimental device for charging and exposure to light. Corona charging was effected at ⊕ 6.0 KV for 0.2 sec., and light exposure through a permeation type test chart by use of a tungsten lamp as light source at a dose of 1.5 lux.sec.

Immediately thereafter, ⊖ charged developer (containing toner and carrier) was cascaded on the surface of the member to obtain a good toner image on the member. When the toner image on the member was transferred on a transfer paper by corona charging at ⊕ 5.0 KV, there was obtained a clear image of high density which was excellent in resolution as well as in gradation reproducibility.

Next, using the above image-forming member, corona charging was effected thereon at ⊖ 5.5 KV for 0.2 sec. in an experimental charging-exposure device, followed immediately by imagewise exposure at a dose of 1.5 lux.sec. Then ⊕ charged developer was cascaded on the surface of the member and transfer of the image and fixing effected on a transfer paper, whereby a very clear image was obtained.

From this result and the previous result, it can be seen that the image-forming member for electrophotography obtained in this Example has no dependency on the charging polarity but it is provided with the characteristics of a both-polarity image-forming member.

EXAMPLE 2

An image-forming member was prepared according to the same procedure and under the same conditions as in Example 1 except that $O_2$ gas was employed in place of $NO_2$ gas. Introduction of $O_2$ gas into the deposition chamber 201 was conducted through a feed pipe specifically provided so that it might not be mixed with other gases prior to introduction into the deposition chamber 201.

In the following Examples, wherein $O_2$ gas or a gas containing $O_2$ was used, the operations were all performed in the same manner as in this Example.

The thus prepared image-forming member was placed in an experimental device for charging and exposure to light. Corona charging was effected at ⊕ 6.0 KV for 0.2 sec., and light exposure through a permeation type test chart by use of a tungsten lamp as light source at a dose of about 1.5 lux.sec.

Immediately thereafter, ⊖ charged developer (containing toner and carrier) was cascaded on the surface of the member to obtain a good toner image on the member. When the toner image on the member was transferred on a transfer paper by corona charging at ⊕ 5.0 KV, there was obtained a clear image of high density which was excellent in resolution as well as in gradation reproducibility.

Next, using the above image-forming member, corona charging was effected thereon at ⊖ 5.5 KV for 0.2 sec. in an experimental charging-exposure device, followed immediately by imagewise exposure at a dose of 1.5 lux.sec. Then ⊕ charged developer was cascaded on the surface of the member and transfer of the image and fixing effected on a transfer paper, whereby a very clear image was obtained.

From this result and the previous result, it can be seen that the image-forming member for electrophotography obtained in this Example has no dependency on the charging polarity but it is provided with the characteristics of a both-polarity image-forming member.

EXAMPLE 3

After intermediate layers were formed on molybdenum substrates according to the same procedure and under the same conditions as in Example 1, photoconductive layers were formed on the intermediate layers according to the same procedure and under the same conditions as in Example 1 except that the gases employed and the relative values of flow amoutns were varied as shown in Table 4. When toner images were formed using the thus prepared image-forming members in a similar way to that in Example 1, better toner images were obtained in case of Sample A3 for the combination of corona charging effected at ⊖ 5.5 KV followed by imagewise exposure with ⊕ charged toner.

On the contrary, better toner images were obtained in case of Sample B3 for the combination of corona charging at ⊕ 6.0 KV followed by imagewise exposure with ⊖ charged toner.

TABLE 4

| | Photoconductive layer | |
|---|---|---|
| Sample | Gases employed for formation of photoconductive layer | Relative value of flow amount |
| A3 | $SiH_4$ | 1 |
| | $Si_2H_6$ | 30 |
| | Ar containing 0.2 vol. % $O_2$ | 69 |
| B3 | $Si_3H_8$ | 30 |
| | $Si_2H_6$ containing 100 vol. ppm $B_2H_6$ | 20 |
| | Ar containing 0.2 vol. % $O_2$ | 50 |

EXAMPLE 4

After intermediate layers were formed on molybdenum substrates according to the same procedure and under the same conditions as in Example 1, photoconductive layers were formed on the intermediate layers according to the same procedure and under the same conditions as in Example 1 except that the gases employed (using increased number of bombs in FIG. 2, if necessary) and the relative values of flow amounts varied as shown in Table 5.

The thus prepared image-forming members were examined from both aspects of productivity (deposition rate) and characteristics (image quality at high temperatures under high humifity and repeatability). As the result, it was found that it is necessary for accomplishment of the object of the present invention to form a photoconductive layer with use of a starting gas mixture in which high order compounds with higher order than that of the minimum order compound with the minimum order of n among those represented by the formula: $Si_2H_{2n+2}$ (wherein n is a positive integer) may be contained in an amount of at least 1 vol.% based on said minimum order compound while controlling the value of the flow amount of $O_2$ gas to 8 vol.% or lower based on the total flow amount of the starting gases represented by the above formula.

In the rightest columns of Tables 5, 8, 11, 14, 17, 20, 23, 26 and 29 image quality was determined by using exposure quantity of 3 lux.sec.

TABLE 5

| Sample | Starting gases (relative flow amount value) | $O_2$ gas (value of $O_2$/ starting gases) | Atmospheric gas (flow amount relative to starting gases) | Deposition rate of film (Å/sec) | Repeatability by 3 sec. cycle | Image quality after standing 1 hr. at high temperature and humidity (35° C., 85% RH) |
|---|---|---|---|---|---|---|
| 4-1 | $SiH_4$ (99.5) / $Si_2H_6$ (0.5) | $5 \times 10^{-3}$ | Ar (30:70) | 10 | △ | X |
| 4-2 | $SiH_4$ (99) / $Si_2H_6$ (1) | $5 \times 10^{-3}$ | Ar (30:70) | 10 | ○ | △ |
| 4-3 | $SiH_4$ (95) / $Si_2H_6$ (5) | $5 \times 10^{-3}$ | Ar (30:70) | 15 | △ | △ |
| 4-4 | $SiH_4$ (90) / $Si_2H_6$ (10) | $5 \times 10^{-3}$ | Ar (30:70) | 20 | △ | ○ |
| 4-5 | $SiH_4$ (80) / $Si_2H_6$ (20) | $8 \times 10^{-2}$ | Ar (30:70) | 22 | ○ | △ |
| 4-6 | $SiH_4$ (70) / $Si_2H_6$ (30) | $5 \times 10^{-2}$ | Ar (30:70) | 25 | ○ | ○ |
| 4-7 | $SiH_4$ (1) / $Si_2H_6$ (99) | $10^{-1}$ | Ar (30:70) | 45 | ○ | X |
| 4-8 | $SiH_4$ (1) / $Si_2H_6$ (99) | $8 \times 10^{-2}$ | Ar (30:70) | 45 | ⊙ | △ |
| 4-9 | $SiH_4$ (1) / $Si_2H_6$ (99) | $10^{-2}$ | Ar (30:70) | 45 | ⊙ | ⊙ |
| 4-10 | $SiH_4$ (1) / $Si_2H_6$ (99) | $10^{-3}$ | Ar (30:70) | 45 | ⊙ | ⊙ |
| 4-11 | $SiH_4$ (1) / $Si_2H_6$ (99) | $10^{-2}$ | He (30:70) | 60 | ⊙ | ⊙ |
| 4-12 | $SiH_4$ (1) / $Si_2H_6$ (99) | $10^{-2}$ | $H_2$ (30:70) | 70 | ○ | ○ |
| 4-13 | $SiH_4$ (1) / $Si_2H_6$ (55) / $Si_3H_8$ (44) | $10^{-2}$ | Ar (30:70) | 90 | ⊙ | ⊙ |
| 4-14 | $SiH_4$ (1) / $Si_2H_6$ (44) / $Si_3H_8$ (55) | $10^{-2}$ | Ar (30:70) | 95 | ⊙ | ⊙ |
| 4-15 | $SiH_4$ (1) / $Si_2H_6$ (55) / $Si_3H_8$ (44) | $10^{-2}$ | | 100 | ⊙ | ⊙ |
| 4-16 | $SiH_4$ (1) / $Si_2H_6$ (64) / $Si_3H_8$ (30) / $Si_4H_{10}$ (5) | $10^{-2}$ | Ar (30:70) | 110 | ⊙ | ⊙ |
| 4-17 | $Si_2H_6$ (65) / $Si_3H_8$ (30) / $Si_4H_{10}$ (5) | $10^{-2}$ | Ar (30:70) | 115 | ⊙ | ⊙ |
| 4-18 | $Si_2H_6$ (70) / $Si_3H_8$ (30) | $10^{-2}$ | Ar (30:70) | 115 | ⊙ | ⊙ |
| 4-19 | $Si_2H_6$ (70) / $Si_3H_8$ (30) | $10^{-2}$ | | 100 | ⊙ | ⊙ |
| 4-20 | $Si_2H_6$ (1) / $Si_3H_8$ (99) | $10^{-2}$ | Ar (30:70) | 120 | ⊙ | ⊙ |
| 4-21 | $Si_2H_6$ (65) / $Si_3H_8$ (30) | $10^{-2}$ | He (30:70) | 100 | ⊙ | ⊙ |

TABLE 5-continued

| Sample | Gases employed for formation of photoconductive layer | | | Deposition rate of film (Å/sec) | Repeatability by 3 sec. cycle | Image quality after standing 1 hr. at high temperature and humidity (35° C., 85% RH) |
|---|---|---|---|---|---|---|
| | Starting gases (relative flow amount value) | O₂ gas (value of O₂/ starting gases) | Atmospheric gas (flow amount relative to starting gases) | | | |
| | Si₄H₁₀ (5) | | | | | |

Standards for evaluation:
⊚: excellent
○ : good
Δ: practically satisfactory
X: practically slightly inferior

EXAMPLE 5

An image-forming member for electrophotography was prepared according to the same procedure and under the same conditions as in Example 1 except for the conditions as shown in Table 6.

TABLE 6

| Conditions for forming photoconductive layer | | | |
|---|---|---|---|
| Gases employed | Flow amount or ratio | Discharging conditions | Layer thickness |
| (1) B₂H₆(10)/Si₂F₆ | 30 | 150 W | 16μ |
| (2) SiF₄ | 1 | | |
| (3) Ar | 69 | | |
| O₂ | 0.1 vol. % of [(1) + (2)] | | |

The thus prepared image-forming member for electrophotography was subjected to the image-forming treatment similarly to that in Example 1 and a toner image was formed on a transfer paper, whereby there was obtained a very clear image.

EXAMPLE 6

After intermediate layers were formed on molybdenum substrates according to the same procedure and under the same conditions as in Example 5, photoconductive layers were formed on the intermediate layers according to the same procedure and under the same conditions as in Example 5 except that the gases employed and the relative values of flow amounts were varied as shown in Table 7. When toner images were formed using the thus prepared image-forming members in a similar way to that in Example 5, better images were obtained in case of Sample A6 for the combination of corona charging effected at ⊖ 5.5 KV followed by imagewise exposure with ⊕ charged toner.
On the contrary, better toner images were ontained in case of Sample B6 for the combination of corona charging at ⊕ 6.0 KV followed by imagewise exposure with ⊖ charged toner.

TABLE 7

| Sample | Gases employed for formation of photoconductive layer | Relative value of flow amount |
|---|---|---|
| A6 | SiF₄ | 1 |
| | Si₂F₆ | 30 |
| | Ar containing 0.2 vol. % O₂ | 69 |
| B6 | Si₃F₈ | 30 |
| | Si₂F₆ containing 100 vol. ppm B₂H₆ | 20 |
| | Ar containing 0.2 vol. % O₂ | 50 |

EXAMPLE 7

After intermediate layers were formed on molybdenum substrates according to the same procedure and under the same conditions as in Example 5, photoconductive layers were formed on the intermediate layers according to the same procedure and under the same conditions as in Example 5 except that the gases employed (using increased number of bombs in FIG. 2, if necessary) and the relative values of flow amounts were varied as shown in Table 8.

The thus prepared image-forming members were examined from both aspects of productivity (deposition rate) and characteristics (image quality at high temperatures under high humidity and repeatability). As the result, it was found that it is necessary for accomplishment of the object of the present invention to form a photoconductive layer with use of a starting gas mixture in which high order compounds with higher order than that of the minimum order compound with the minimum order of m among those represented by the formula: $Si_mF_{2m+2}$ (wherein m is a positive integer) may be contained in an amount of at least 1 vol.% based on said minimum order compound while controlling the value of the flow amount of O₂ gas to 8 vol.% or lower based on the total flow amount of the starting gases represented by the above formula. The standards for evaluation are the same as in Table 5.

TABLE 8

| Sample | Gases employed for formation of photoconductive layer | | | Deposition rate of film (Å/sec) | Repeatability by 3 sec. cycle | Image quality after standing 1 hr. at high temperature and humidity (35° C., 85% RH) |
|---|---|---|---|---|---|---|
| | Starting gases (relative flow amount value) | O₂ gas (value of O₂/ starting gases) | Atmospheric gas (flow amount relative to starting gases) | | | |
| 7-1 | SiF₄ (99.5) Si₂F₆ (0.5) | 5 × 10⁻³ | Ar (30:70) | 10 | Δ | X |
| 7-2 | SiF₄ (99) Si₂F₆ (1) | 5 × 10⁻³ | Ar (30:70) | 10 | ○ | Δ |
| 7-3 | SiF₄ (95) Si₂F₆ (5) | 5 × 10⁻³ | Ar (30:70) | 15 | Δ | Δ |
| 7-4 | SiF₄ (90) Si₂F₆ (10) | 5 × 10⁻³ | Ar (30:70) | 20 | Δ | ○ |
| 7-5 | SiF₄ (80) | 8 × 10⁻² | Ar | 22 | ○ | Δ |

TABLE 8-continued

| Sample | Gases employed for formation of photoconductive layer | | | Deposition rate of film(Å/sec) | Repeatability by 3 sec. cycle | Image quality after standing 1 hr. at high temperature and humidity (35° C., 85% RH) |
|---|---|---|---|---|---|---|
| | Starting gases (relative flow amount value) | O$_2$ gas (value of O$_2$/ starting gases) | Atmospheric gas (flow amount relative to starting gases) | | | |
| 7-6 | Si$_2$F$_6$ (20) SiF$_4$ (70) Si$_2$F$_6$ (30) | 5 × 10$^{-2}$ | (30:70) Ar (30:70) | 25 | ○ | ○ |
| 7-7 | SiF$_4$ (1) Si$_2$F$_6$ (99) | 10$^{-1}$ | Ar (30:70) | 45 | ○ | X |
| 7-8 | SiF$_4$ (1) Si$_2$F$_6$ (99) | 8 × 10$^{-2}$ | Ar (30:70) | 45 | ◉ | △ |
| 7-9 | SiF$_4$ (1) Si$_2$F$_6$ (99) | 10$^{-2}$ | Ar (30:70) | 45 | ◉ | ◉ |
| 7-10 | SiF$_4$ (1) Si$_2$F$_6$ (99) | 10$^{-3}$ | Ar (30:70) | 45 | ◉ | ◉ |
| 7-11 | SiF$_4$ (1) Si$_2$F$_6$ (99) | 10$^{-2}$ | He (30:70) | 60 | ◉ | ◉ |
| 7-12 | SiF$_4$ (1) Si$_2$F$_6$ (99) | 10$^{-2}$ | H$_2$ (30:70) | 70 | ○ | ○ |
| 7-13 | SiF$_4$ (1) Si$_2$F$_6$ (55) Si$_3$F$_8$ (44) | 10$^{-2}$ | Ar (30:70) | 90 | ◉ | ◉ |
| 7-14 | SiF$_4$ (1) Si$_2$F$_6$ (44) Si$_3$F$_8$ (55) | 10$^{-2}$ | Ar (30:70) | 95 | ◉ | ◉ |
| 7-15 | SiF$_4$ (1) Si$_2$F$_6$ (55) Si$_3$F$_8$ (44) | 10$^{-2}$ | | 100 | ◉ | ◉ |
| 7-16 | SiF$_4$ (1) Si$_2$F$_6$ (64) Si$_3$F$_8$ (30) Si$_4$F$_{10}$ (5) | 10$^{-2}$ | Ar (30:70) | 110 | ◉ | ◉ |
| 7-17 | Si$_2$F$_6$ (65) Si$_3$F$_8$ (30) Si$_4$F$_{10}$ (5) | 10$^{-2}$ | Ar (30:70) | 115 | ◉ | ◉ |
| 7-18 | Si$_2$F$_6$ (70) Si$_3$F$_8$ (30) | 10$^{-2}$ | Ar (30:70) | 115 | ◉ | ◉ |
| 7-19 | Si$_2$F$_6$ (70) Si$_3$F$_8$ (30) | 10$^{-2}$ | | 100 | ◉ | ◉ |
| 7-20 | Si$_2$F$_6$ (1) Si$_3$F$_8$ (99) | 10$^{-2}$ | Ar (30:70) | 120 | ◉ | ◉ |
| 7-21 | Si$_2$F$_6$ (65) Si$_3$F$_8$ (30) Si$_4$F$_{10}$ (5) | 10$^{-2}$ | He (30:70) | 100 | ◉ | ◉ |

EXAMPLE 8

An image-forming member for electrophotography was prepared according to the same procedure and under the same conditions as in Example 1 except for the conditions as shown in Table 9.

TABLE 9

| Conditions for forming photoconductive layer | | | |
|---|---|---|---|
| Gases employed | Flow amount or ratio | Discharging conditions | Layer thickness |
| (1) B$_2$H$_6$(10)/Si$_2$H$_6$ | 30 | 100 W | 18μ |
| (2) SiH$_4$ | 1 | | |
| (3) Ar | 69 | | |
| C$_2$H$_4$ | 0.2 vol. % of [(1) + (2)] | | |

The thus prepared image-forming member for electrophotography was subjected to the image-forming treatment similarly to that in Example 1 and a toner image was formed on a transfer paper, whereby there was obtained a very clear image.

EXAMPLE 9

After intermediate layers were formed on molybdenum substrates according to the same procedure and under the same conditions as in Example 8, photoconductive layers were formed on the intermediate layers according to the same procedure and under the same conditions as in Example 8 except that the gases employed and the relative values of flow amounts were varied as shown in Table 10. When toner images were formed using the thus prepared image-forming members in a similar way to that in Example 8, better images were obtained in case of Sample A9 for the combination of corona charging effected at ⊖ 5.5 KV followed by imagewise exposure with ⊕ charged toner.

On the contrary, better toner images were obtained in case of Sample B9 for the combination of corona charging at ⊕ 6.0 KV followed by imagewise exposure with ⊖ changed toner.

TABLE 10

| Sample | Gases employed for formation of photoconductive layer | Relative value of flow amount |
|---|---|---|
| A9 | SiH$_4$ | 1 |
|  | Si$_2$H$_6$ | 30 |
|  | Ar containing 0.3 vol. % C$_2$H$_4$ | 69 |
| B9 | Si$_3$H$_8$ | 30 |
|  | Si$_2$H$_6$ containing 100 vol. ppm B$_2$H$_6$ | 20 |
|  | Ar containing 0.3 vol. % C$_2$H$_4$ | 50 |

EXAMPLE 10

After intermediate layers were formed on molybdenum substrates according to the same procedure and under the same conditions as in Example 8, photoconductive layers were formed on the intermediate layers according to the same procedure and under the same conditions as in Example 8 except that the gases employed (using increased number of bombs in FIG. 2, if necessary) and the relative values of flow amounts were varied as shown in Table 11.

The thus prepared image-forming members were examined from both aspects of productivity (deposition rate) and characteristics (image quality at high temperatures under high humidity and repeatability). As the result, it was found that it is necessary for accomplishment of the object of the present invention to form a photoconductive layer with use of a starting gas mixture in which high order compounds with higher order than that of the minimum order compound with the minimum order of n among those represented by the formula: Si$_n$H$_{2n+2}$ (wherein n is a positive integer) may be contained in an amount of at least 1 vol.% based on said minimum order compound while controlling the values of flow amounts of CH$_4$, C$_2$H$_4$, and C$_3$H$_8$ gases to 15 vol.% or lower based on the total flow amount of the starting gases represented by the above formula. The standards for evaluation in Table 11 are the same as in Table 5.

TABLE 11

| Sample | Gases employed for formation of photoconductive layer | | | Deposition rate of film (Å/sec) | Repeatability by 3 sec. cycle | Image quality after standing 1 hr. at high temperature and humidity (35° C., 85% RH) |
|---|---|---|---|---|---|---|
|  | Starting gases (relative flow amount value) | Carbon-containing substance (ratio to starting gases) | Atmospheric gas (flow amount relative to starting gases) |  |  |  |
| 10-1 | SiH$_4$ (99.5) Si$_2$H$_6$ (0.5) | C$_2$H$_4$(7 × 10$^{-3}$) | Ar (30:70) | 10 | △ | X |
| 10-2 | SiH$_4$ (99) Si$_2$H$_6$ (1) | C$_2$H$_4$(7 × 10$^{-3}$) | Ar (30:70) | 10 | ○ | △ |
| 10-3 | SiH$_4$ (95) Si$_2$H$_6$ (5) | C$_2$H$_4$(7 × 10$^{-3}$) | Ar (30:70) | 15 | △ | △ |
| 10-4 | SiH$_4$ (90) Si$_2$H$_6$ (10) | C$_2$H$_4$(7 × 10$^{-3}$) | Ar (30:70) | 20 | △ | ○ |
| 10-5 | SiH$_4$ (80) Si$_2$H$_6$ (20) | C$_2$H$_4$(1.5 × 10$^{-2}$) | Ar (30:70) | 22 | ○ | △ |
| 10-6 | SiH$_4$ (70) Si$_2$H$_6$ (30) | C$_2$H$_4$(7 × 10$^{-2}$) | Ar (30:70) | 25 | ○ | ○ |
| 10-7 | SiH$_4$ (1) Si$_2$H$_6$ (99) | C$_2$H$_4$(2 × 10$^{-1}$) | Ar (30:70) | 45 | ○ | X |
| 10-8 | SiH$_4$ (1) Si$_2$H$_6$ (99) | C$_2$H$_4$(1.5 × 10$^{-2}$) | Ar (30:70) | 45 | ⊙ | △ |
| 10-9 | SiH$_4$ (1) Si$_2$H$_6$ (99) | C$_2$H$_4$ 2 × 10$^{-2}$ | Ar (30:70) | 45 | ⊙ | ⊙ |
| 10-10 | SiH$_4$ (1) Si$_2$H$_6$ (99) | C$_2$H$_4$ 2 × 10$^{-3}$ | Ar (30:70) | 45 | ⊙ | ⊙ |
| 10-11 | SiH$_4$ (1) Si$_2$H$_6$ (99) | C$_2$H$_4$ 2 × 10$^{-2}$ | He (30:70) | 60 | ⊙ | ⊙ |
| 10-12 | SiH$_4$ (1) Si$_2$H$_6$ (99) | C$_2$H$_4$ 2 × 10$^{-2}$ | H$_2$ (30:70) | 70 | ○ | ○ |
| 10-13 | SiH$_4$ (1) Si$_2$H$_6$ (55) Si$_3$H$_8$ (44) | C$_2$H$_4$ 2 × 10$^{-2}$ | Ar (30:70) | 90 | ⊙ | ⊙ |
| 10-14 | SiH$_4$ (1) Si$_2$H$_6$ (44) Si$_3$H$_8$ (55) | C$_2$H$_4$ 2 × 10$^{-2}$ | Ar (30:70) | 95 | ⊙ | ⊙ |
| 10-15 | SiH$_4$ (1) Si$_2$H$_6$ (55) Si$_3$H$_8$ (44) | C$_2$H$_4$ 2 × 10$^{-2}$ |  | 100 | ⊙ | ⊙ |
| 10-16 | SiH$_4$ (1) Si$_2$H$_6$ (64) Si$_3$H$_8$ (30) Si$_4$H$_{10}$ (5) | C$_2$H$_4$ 2 × 10$^{-2}$ | Ar (30:70) | 110 | ⊙ | ⊙ |
| 10-17 | Si$_2$H$_6$ (65) Si$_3$H$_8$ (30) | C$_2$H$_4$ 2 × 10$^{-2}$ | Ar | 115 | ⊙ | ⊙ |

TABLE 11-continued

| Sample | Gases employed for formation of photoconductive layer | | | Deposition rate of film (Å/sec) | Repeatability by 3 sec. cycle | Image quality after standing 1 hr. at high temperature and humidity (35° C., 85% RH) |
|---|---|---|---|---|---|---|
| | Starting gases (relative flow amount value) | Carbon-containing substance (ratio to starting gases) | Atmospheric gas (flow amount relative to starting gases) | | | |
| 10-18 | Si$_4$H$_{10}$ (5) Si$_2$H$_6$ (70) Si$_3$H$_8$ (30) | C$_2$H$_4$ 2 × 10$^{-2}$ | (30:70) Ar (30:70) | 115 | ⊚ | ⊚ |
| 10-19 | Si$_2$H$_6$ (70) Si$_3$H$_8$ (30) | C$_2$H$_4$ 2 × 10$^{-2}$ | | 100 | ⊚ | ⊚ |
| 10-20 | Si$_2$H$_6$ (1) Si$_3$H$_8$ (99) | C$_2$H$_4$ 2 × 10$^{-2}$ | Ar (30:70) | 120 | ⊚ | ⊚ |
| 10-21 | Si$_2$H$_6$ (65) Si$_3$H$_8$ (30) Si$_4$H$_{10}$ (5) | C$_2$H$_4$ 2 × 10$^{-2}$ | He (30:70) | 100 | ⊚ | ⊚ |
| 10-22 | Si$_2$H$_6$ (70) Si$_3$H$_8$ (30) | CH$_4$ 4 × 10$^{-2}$ | Ar (30:70) | 115 | ⊚ | ⊚ |
| 10-23 | Si$_2$H$_6$ (70) Si$_3$H$_8$ (30) | C$_3$H$_8$ 1.5 × 10$^{-2}$ | Ar (30:70) | 115 | ⊚ | ⊚ |

EXAMPLE 11

An image-forming member for electrophotography was prepared according to the same procedure and under the same conditions as in Example 1 except for the conditions as shown in Table 12.

TABLE 12

| Conditions for forming photoconductive layer | | | |
|---|---|---|---|
| Gases employed | Flow amount or ratio | Discharging conditions | Layer thickness |
| (1) B$_2$H$_6$(10)/Si$_2$F$_6$ | 30 | 150 W | 16μ |
| (2) SiF$_4$ | 1 | | |
| (3) Ar | 69 | | |
| C$_2$H$_4$ | 0.2 vol. % of [(1) + (2)] | | |

The thus prepared image-forming member for electrophotography was subjected to the image-forming treatment similarly to that in Example 1 and a toner image was formed on a transfer paper, whereby there was obtained a very clear image.

EXAMPLE 12

After intermediate layers were formed on molybdenum substrates according to the same procedure and under the same conditions as in Example 11, photoconductive layers were formed on the intermediate layers according to the same procedure and under the same conditions as in Example 11 except that the gases employed and the relative values of flow amounts were varied as shown in Table 13. When toner images were formed using the thus prepared image-forming members in a similar way to that in Example 11, better images were obtained in case of Sample A12 for the combination of corona charging effected at ⊖ 5.5 KV followed by imagewise exposure with ⊕ charged toner.

On the contrary, better toner images were obtained in case of Sample B12 for the combination of corona charging at ⊕ 6.0 KV followed by imagewise exposure with ⊖ charged toner.

TABLE 13

| | Photoconductive layer | |
|---|---|---|
| Sample | Gases employed for formation of photoconductive layer | Relative value of flow amount |
| A12 | SiF$_4$ | 1 |
| | Si$_2$F$_6$ | 30 |
| | Ar containing 0.3 vol. % C$_2$H$_4$ | 69 |
| B12 | Si$_3$F$_8$ | 30 |
| | Si$_2$F$_6$ containing 100 vol. ppm B$_2$H$_6$ | 20 |
| | Ar containing 0.3 vol. % C$_2$H$_4$ | 50 |

EXAMPLE 13

After intermediate layers were formed on molybdenum substrates according to the same procedure and under the same conditions as in Example 11, photoconductive layers were formed on the intermediate layers according to the same procedure and under the same conditions as in Example 11 except that the gases employed (using increased number of bombs in FIG. 2, if necessary) and the relative values of flow amounts were varied as shown in Table 14.

The thus prepared image forming members were examined from both aspects of productivity (deposition rate) and characteristics (image quality at high temperatures under high humidity and repeatability). As the result, it was found that it is necessary for accomplishment of the object of the present invention to form a photoconductive layer with use of a starting gas mixture in which high order compounds with higher order than that of the minimum order compound with the minimum order of m among those represented by the formula: Si$_m$F$_{2m+2}$ (wherein m is a positive integer) may be contained in an amount of at least 1 vol.% based on said minimum order compound while controlling the values of flow amounts of CH$_4$, C$_2$H$_4$, and C$_3$H$_8$ gases to 15 vol.% or lower based on the total flow amount of the starting gases represented by the above formula. The standards for evaluation in Table 14 are the same as in Table 5.

TABLE 14

| Sample | Starting gases (relative flow amount value) | Carbon-containing substance (ratio to starting gases) | Atmospheric gas (flow amount relative to starting gases) | Deposition rate of film (Å/sec) | Repeatability by 3 sec. cycle | Image quality after standing 1 hr. at high temperature and humidity (35° C., 85% RH) |
|---|---|---|---|---|---|---|
| 13-1 | SiF$_4$ (99.5) / Si$_2$F$_6$ (0.5) | C$_2$H$_4$ (7 × 10$^{-3}$) | Ar (30:70) | 10 | △ | X |
| 13-2 | SiF$_4$ (99) / Si$_2$F$_6$ (1) | C$_2$H$_4$ (7 × 10$^{-3}$) | Ar (30:70) | 10 | ○ | △ |
| 13-3 | SiF$_4$ (95) / Si$_2$F$_6$ (5) | C$_2$H$_4$ (7 × 10$^{-3}$) | Ar (30:70) | 15 | △ | △ |
| 13-4 | SiF$_4$ (90) / Si$_2$F$_6$ (10) | C$_2$H$_4$ (7 × 10$^{-3}$) | Ar (30:70) | 20 | △ | ○ |
| 13-5 | SiF$_4$ (80) / Si$_2$F$_6$ (20) | C$_2$H$_4$ (7 × 10$^{-2}$) | Ar (30:70) | 22 | ○ | △ |
| 13-6 | SiF$_4$ (70) / Si$_2$F$_6$ (30) | C$_2$H$_4$ (7 × 10$^{10-2}$) | Ar (30:70) | 25 | ○ | ○ |
| 13-7 | SiF$_4$ (1) / Si$_2$F$_6$ (99) | C$_2$H$_4$ (2 × 10$^{-1}$) | Ar (30:70) | 45 | ○ | X |
| 13-8 | SiF$_4$ (1) / Si$_2$F$_6$ (99) | C$_2$H$_4$ (1.5 × 10$^{-2}$) | Ar (30:70) | 45 | ⊙ | △ |
| 13-9 | SiF$_4$ (1) / Si$_2$F$_6$ (99) | C$_2$H$_4$ 2 × 10$^{-2}$ | Ar (30:70) | 45 | ⊙ | ⊙ |
| 13-10 | SiF$_4$ (1) / Si$_2$F$_6$ (99) | C$_2$H$_4$ 2 × 10$^{-3}$ | Ar (30:70) | 45 | ⊙ | ⊙ |
| 13-11 | SiF$_4$ (1) / Si$_2$F$_6$ (99) | C$_2$H$_4$ 2 × 10$^{-2}$ | He (30:70) | 60 | ⊙ | ⊙ |
| 13-12 | SiF$_4$ (1) / Si$_2$F$_6$ (99) | C$_2$H$_4$ 2 × 10$^{-2}$ | H$_2$ (30:70) | 70 | ○ | ○ |
| 13-13 | SiF$_4$ (1) / Si$_2$F$_6$ (55) / Si$_3$F$_8$ (44) | C$_2$H$_4$ 2 × 10$^{-2}$ | (30:70) | 90 | ⊙ | ⊙ |
| 13-14 | SiF$_4$ (1) / Si$_2$F$_6$ (44) / Si$_3$F$_8$ (55) | C$_2$H$_4$ 2 × 10$^{-2}$ | Ar (30:70) | 95 | ⊙ | ⊙ |
| 13-15 | SiF$_4$ (1) / Si$_2$F$_6$ (55) / Si$_3$F$_8$ (44) | C$_2$H$_4$ 2 × 10$^{-2}$ | | 100 | ⊙ | ⊙ |
| 13-16 | SiF$_4$ (1) / Si$_2$F$_6$ (64) / Si$_3$F$_8$ (30) / Si$_4$F$_{10}$ (5) | C$_2$H$_4$ 2 × 10$^{-2}$ (30:70) | Ar | 110 | ⊙ | ⊙ |
| 13-17 | Si$_2$F$_6$ (65) / Si$_3$F$_8$ (30) / Si$_4$F$_{10}$ (5) | C$_2$H$_4$ 2 × 10$^{-2}$ | Ar (30:70) | 115 | ⊙ | ⊙ |
| 13-18 | Si$_2$F$_6$ (70) / Si$_3$F$_8$ (30) | C$_2$H$_4$ 2 × $^{-2}$ | Ar (30:70) | 115 | ⊙ | ⊙ |
| 13-19 | Si$_2$F$_6$ (70) / Si$_3$F$_8$ (30) | C$_2$H$_4$ 2 × 10$^{-2}$ | | 100 | ⊙ | ⊙ |
| 13-20 | Si$_2$F$_6$ (1) / Si$_3$F$_8$ (99) | C$_2$H$_4$ 2 × 10$^{-2}$ | Ar (30:70) | 120 | ⊙ | ⊙ |
| 13-21 | Si$_2$F$_6$ (65) / Si$_3$F$_8$ (30) / Si$_4$F$_{10}$ (5) | C$_2$H$_4$ 2 × 10$^{-2}$ | He (30:70) | 100 | ⊙ | ⊙ |
| 13-22 | Si$_2$F$_6$ (65) / Si$_3$F$_8$ (30) / Si$_4$F$_{10}$ (5) | CH$_4$ 4 × 10$^{-2}$ | Ar (30:70) | 115 | ⊙ | ⊙ |
| 13-23 | Si$_2$F$_6$ (65) / Si$_3$F$_8$ (30) / Si$_4$F$_{10}$ (5) | C$_3$H$_8$ 1.5 × 10$^{-2}$ | Ar (30:70) | 115 | ⊙ | ⊙ |

EXAMPLE 14

An image-forming member for electrophotography was prepared according to the same procedure and under the same conditions as in Example 1 except for the conditions as shown in Table 15.

TABLE 15

| | Conditions for forming photoconductive layer | | |
|---|---|---|---|
| Gases employed | Flow amount or ratio | Discharging conditions | Layer thickness |
| (1) $B_2H_6(10)/Si_2H_6$ | 30 | 100 W | 18μ |
| (2) $SiF_4$ | 1 | | |
| (3) Ar | 69 | | |
| $N_2$ | 0.5 vol. % of [(1) + (2)] | | |

The thus prepared image-forming member for electrophotography was subjected to the image-forming treatment similarly to that in Example 1 and a toner image was formed on a transfer paper, whereby there was obtained a very clear image.

EXAMPLE 15

After intermediate layers were formed on molybdenum substrates according to the same procedure and under the same conditions as in Example 14, photoconductive layers were formed on the intermediate layers according to the same procedure and under the same conditions as in Example 14 except that the gases employed and the relative values of flow amounts were varied as shown in Table 16. When toner images were formed using the thus prepared image-forming members, better images were obtained in case of Sample A15 for the combination of corona charging effected at ⊖ 5.5 KV followed by imagewise exposure with ⊕ charged toner.

On the contrary, better toner images were obtained in case of Sample B15 for the combination of corona charging at ⊕ 6.0 KV followed by imagewise exposure with ⊖ charged toner.

TABLE 16

| | Photoconductive layer | |
|---|---|---|
| Sample | Gases employed for formation of photoconductive layer | Relative value of flow amount |
| A15 | $SiH_4$ | 1 |
| | $Si_2H_6$ | 30 |
| | Ar containing 0.4 vol. % $N_2$ | 69 |
| B15 | $Si_3H_8$ | 30 |
| | $Si_2H_6$ containing 100 vol. ppm $B_2H_6$ | 20 |
| | Ar containing 0.4 vol. % $N_2$ | 50 |

EXAMPLE 16

After intermediate layers were formed on molybdenum substrates according to the same procedure and under the same conditions as in Example 14, photoconductive layers were formed on the intermediate layers according to the same procedure and under the same conditions as in Example 14 except that the gases employed (using increased number of bombs in FIG. 2 if necessary) and the relative values of flow amounts were varied as shown in Table 17.

The thus prepared image-forming members were examined from both aspects of productivity (deposition rate) and characteristics (image quality at high temperatures under high humidity and repeatability). As the result, it was found that it is necessary for accomplishment of the object of the present invention to form a photoconductive layer with use of a starting gas mixture in which high order compounds with higher order than that of the minimum order compound with the minimum order of n among those represented by the formula: $Si_nH_{2n+2}$ (wherein n is a positive integer) may be contained in an amount of at least 1 vol.% based on said minimum order compound while controlling the value of flow amount of $N_2$ or $NH_3$ gas to 50 vol.% or lower based on the total flow amount of the starting gases represented by the above formula. The standards for evaluation in Table 17 are the same as in Table 5.

TABLE 17

| | Gases employed for formation of photoconductive layer | | | | | Image quality after standing 1 hr. |
|---|---|---|---|---|---|---|
| Sample | Starting gases (relative flow amount value) | Nitrogen-containing substance (ratio to starting gases) | Atmospheric gas (flow amount relative to starting gases) | Deposition rate of film(Å/sec) | Repeatability by 3 sec.cycle | at high temperature and humidity (35° C., 85% RH) |
| 16-1 | $SiH_4$ (99.5) $Si_2H_6$ (0.5) | $N_2$ $10^{-2}$ | Ar (30:70) | 10 | △ | X |
| 16-2 | $SiH_4$ (99) $Si_2H_6$ (1) | $N_2$ $10^{-2}$ | Ar (30:70) | 10 | O | △ |
| 16-3 | $SiH_4$ (95) $Si_2H_6$ (5) | $N_2$ $10^{-2}$ | Ar (30:70) | 15 | △ | △ |
| 16-4 | $SiH_4$ (90) $Si_2H_6$ (10) | $N_2$ $10^{-2}$ | Ar (30:70) | 20 | △ | O |
| 16-5 | $SiH_4$ (80) $Si_2H_6$ (20) | $N_2$ $5 \times 10^{-1}$ | Ar (30:70) | 22 | O | △ |
| 16-6 | $SiH_4$ (70) $Si_2H_6$ (30) | $N_2$ $10^{-1}$ | Ar (30:70) | 25 | O | O |
| 16-7 | $SiH_4$ (1) $Si_2H_6$ (99) | $N_2$ $8 \times 10^{-1}$ | Ar (30:70) | 45 | | X |
| 16-8 | $SiH_4$ (1) $Si_2H_6$ (99) | $N_2$ $5 \times 10^{-1}$ | Ar (30:70) | 45 | ⊙ | △ |
| 16-9 | $SiH_4$ (1) $Si_2H_6$ (99) | $N_2$ $5 \times 10^{-2}$ | Ar (30:70) | 45 | ⊙ | ⊙ |
| 16-10 | $SiH_4$ (1) | $N_2$ $5 \times 10^{-3}$ | Ar | 45 | ⊙ | ⊙ |

TABLE 17-continued

| Sample | Gases employed for formation of photoconductive layer | | | Deposition rate of film(Å/sec) | Repeatability by 3 sec.cycle | Image quality after standing 1 hr. at high temperature and humidity (35° C., 85% RH) |
|---|---|---|---|---|---|---|
| | Starting gases (relative flow amount value) | Nitrogen-containing substance (ratio to starting gases) | Atmospheric gas (flow amount relative to starting gases) | | | |
| 16-11 | SiH$_4$ (1)<br>Si$_2$H$_6$ (99) | N$_2$ 5 × 10$^{-2}$ | (30:70)<br>He<br>(30:70) | 60 | ⊙ | ⊙ |
| 16-12 | SiH$_4$ (1)<br>Si$_2$H$_6$ (99) | N$_2$ 5 × 10$^{-2}$ | H$_2$<br>(30:70) | 70 | ○ | ○ |
| 16-13 | SiH$_4$ (1)<br>Si$_2$H$_6$ (55)<br>Si$_3$H$_8$ (44) | N$_2$ 5 × 10$^{-2}$ | Ar<br>(30:70) | 90 | ⊙ | ⊙ |
| 16-14 | SiH$_4$ (1)<br>Si$_2$H$_6$ (44)<br>Si$_3$H$_8$ (55) | N$_2$ 5 × 10$^{-2}$ | Ar<br>(30:70) | 95 | ⊙ | ⊙ |
| 16-15 | SiH$_4$ (1)<br>Si$_2$H$_6$ (55)<br>Si$_3$H$_8$ (44) | N$_2$ 5 × 10$^{-2}$ | | 100 | ⊙ | ⊙ |
| 16-16 | SiH$_4$ (1)<br>Si$_2$H$_6$ (64)<br>Si$_3$H$_8$ (30)<br>Si$_4$H$_{10}$ (5) | N$_2$ 5 × 10$^{-2}$ | Ar<br>(30:70) | 110 | ⊙ | ⊙ |
| 16-17 | Si$_2$H$_6$ (65)<br>Si$_3$H$_8$ (30)<br>Si$_4$H$_{10}$ (5) | N$_2$ 5 × 10$^{-2}$ | Ar<br>(30:70) | 115 | ⊙ | ⊙ |
| 16-18 | Si$_2$H$_6$ (70)<br>Si$_3$H$_8$ (30) | N$_2$ 5 × 10$^{-2}$ | Ar<br>(30:70) | 115 | ⊙ | ⊙ |
| 16-19 | Si$_2$H$_6$ (70)<br>Si$_3$H$_8$ (30) | N$_2$ 5 × 10$^{-2}$ | | 100 | ⊙ | ⊙ |
| 16-20 | Si$_2$H$_6$ (1)<br>Si$_3$H$_8$ (99) | N$_2$ 5 × 10$^{-2}$ | Ar<br>(30:70) | 120 | ⊙ | ⊙ |
| 16-21 | Si$_2$H$_6$ (65)<br>Si$_3$H$_8$ (30)<br>Si$_4$H$_{10}$ (5) | N$_2$ 5 × 10$^{-2}$ | He<br>(30:70) | 100 | ⊙ | ⊙ |
| 16-22 | Si$_2$H$_6$ (65)<br>Si$_3$H$_8$ (30)<br>Si$_4$H$_{10}$ (5) | NH$_3$ 5 × 10$^{-2}$ | Ar<br>(30:70) | 115 | ⊙ | ⊙ |

EXAMPLE 17

An image-forming member for electrophotography was prepared according to the same procedure and under the same conditions as in Example 1 except for the conditions as shown in Table 18.

TABLE 18

| | Conditions for forming photoconductive layer | | |
|---|---|---|---|
| Gases employed | Flow amount or ratio | Discharging conditions | Layer thickness |
| (1) B$_2$H$_6$(5)/Si$_2$F$_6$ | 30 | 150 W | 16μ |
| (2) SiF$_4$ | 1 | | |
| (3) Ar | 69 | | |
| N$_2$ | 0.5 vol. % of [(1) + (2)] | | |

The thus prepared image-forming member for electrophotography was subjected to the image-forming treatment similarly to that in Example 1 and a toner image was formed on a transfer paper, whereby there was obtained a very clear image.

EXAMPLE 18

After intermediate layers were formed on molybdenum substrates according to the same procedure and under the same conditions as in Example 17, photoconductive layers were formed on the intermediate layers according to the same procedure and under the same conditions as in Example 17 except that the gases employed and the relative values of flow amounts were varied as shown in Table 19. When toner images were formed using the thus prepared image-forming members in a similar way to that in Example 17, better images were obtained in case of Sample A18 for the combination of corona charging effected at ⊖ 5.5 KV followed by imagewise exposure with ⊕ charged toner.

On the contrary, better toner images were obtained in case of Sample B18 for the combination of corona charging at ⊕ 6.0 KV followed by imagewise exposure with ⊖ charged toner.

TABLE 19

| | Photoconductive layer | |
|---|---|---|
| Sample | Gases employed for formation of photoconductive layer | Relative value of flow amount |
| A18 | SiF$_4$ | 1 |
| | Si$_2$F$_6$ | 30 |
| | Ar containing 0.4 vol. % N$_2$ | 69 |
| B18 | Si$_3$F$_8$ | 30 |
| | Si$_2$F$_6$ containing 100 vol. ppm B$_2$H$_6$ | 20 |
| | Ar containing 0.4 vol. % N$_2$ | 50 |

EXAMPLE 19

After intermediate layers were formed on molybdenum substrates according to the same procedure and under the same conditions as in Example 17, photoconductive layers were formed on the intermediate layers according to the same procedure and under the same conditions as in Example 17 except that the gases employed (using increased number of bombs in FIG. 2, if necessary) and the relative values of flow amounts were varied as shown in Table 20.

The thus prepared image-forming members were examined from both aspects of productivity (deposition rate) and characteristics (image quality at high temperatures under high humidity and repeatability). As the result, it was found that it is necessary for accomplishment of the object of the present invention to form a photoconductive layer with use of a starting gas mixture in which high order compounds with higher order than that of the minimum order compound with the minimum order of m among those represented by the formula: $Si_mF_{2m+2}$ (wherein m is a positive integer) may be contained in an amount of at least 1 vol.% based on said minimum order compound while controlling the value of the flow amount of $N_2$ or $NH_3$ gas to 50 vol.% or lower based on the total flow amount of the starting gases represented by the above formula. The standards for evaluation in Table 20 are the same as in Table 5.

TABLE 20

| Sample | Gases employed for formation of photoconductive layer | | | Deposition rate of film(Å/sec) | Repeatability by 3 sec.cycle | Image quality after standing 1 hr. at high temperature and humidity (35° C., 85% RH) |
|---|---|---|---|---|---|---|
| | Starting gases (relative flow amount value) | Nitrogen-containing substance (ratio to starting gases) | Atmospheric gas (flow amount relative to starting gases) | | | |
| 19-1 | SiF$_4$ (99.5) Si$_2$F$_6$ (0.5) | N$_2$ 10$^{-2}$ | Ar (30:70) | 10 | △ | X |
| 19-2 | SiF$_4$ (99) Si$_2$F$_6$ (1) | N$_2$ 10$^{-2}$ | Ar (30:70) | 10 | ○ | △ |
| 19-3 | SiF$_4$ (95) Si$_2$F$_6$ (5) | N$_2$ 10$^{-2}$ | Ar (30:70) | 15 | △ | △ |
| 19-4 | SiF$_4$ (90) Si$_2$F$_6$ (10) | N$_2$ 10$^{-2}$ | Ar (30:70) | 20 | △ | ○ |
| 19-5 | SiF$_4$ (80) Si$_2$F$_6$ (20) | N$_2$ 5 × 10$^{-1}$ | Ar (30:70) | 22 | ○ | △ |
| 19-6 | SiF$_4$ (70) Si$_2$F$_6$ (30) | N$_2$ 10$^{-1}$ | Ar (30:70) | 25 | ○ | ○ |
| 19-7 | SiF$_4$ (1) Si$_2$F$_6$ (99) | N$_2$ 8 × 10$^{-1}$ | Ar (30:70) | 45 | ○ | X |
| 19-8 | SiF$_4$ (1) Si$_2$F$_6$ (99) | N$_2$ 5 × 10$^{-1}$ | Ar (30:70) | 45 | ◎ | △ |
| 19-9 | SiF$_4$ (1) Si$_2$F$_6$ (99) | N$_2$ 5 × 10$^{-2}$ | Ar (30:70) | 45 | ◎ | ◎ |
| 19-10 | SiF$_4$ (1) Si$_2$F$_6$ (99) | N$_2$ 5 × 10$^{-3}$ | Ar (30:70) | 45 | ◎ | ◎ |
| 19-11 | SiF$_4$ (1) Si$_2$F$_6$ (99) | N$_2$ 5 × 10$^{-2}$ | He (30:70) | 60 | ◎ | ◎ |
| 19-12 | SiF$_4$ (1) Si$_2$F$_6$ (99) | N$_2$ 5 × 10$^{-2}$ | H$_2$ (30:70) | 70 | ○ | ○ |
| 19-13 | SiF$_4$ (1) Si$_2$F$_6$ (55) Si$_3$F$_8$ (44) | N$_2$ 5 × 10$^{-2}$ | Ar (30:70) | 90 | ◎ | ◎ |
| 19-14 | SiF$_4$ (1) Si$_2$F$_6$ (44) Si$_3$F$_8$ (55) | N$_2$ 5 × 10$^{-2}$ | Ar (30:70) | 95 | ◎ | ◎ |
| 19-15 | SiF$_4$ (1) Si$_2$F$_6$ (55) Si$_3$F$_8$ (44) | N$_2$ 5 × 10$^{-2}$ | | 100 | ◎ | ◎ |
| 19-16 | SiF$_4$ (1) Si$_2$F$_6$ (64) Si$_3$F$_8$ (30) Si$_4$F$_{10}$ (5) | N$_2$ 5 × 10$^{-2}$ | Ar (30:70) | 110 | ◎ | ◎ |
| 19-17 | Si$_2$F$_6$ (65) Si$_3$F$_8$ (30) Si$_4$F$_{10}$ (5) | N$_2$ 5 × 10$^{-2}$ | Ar (30:70) | 115 | ◎ | ◎ |
| 19-18 | Si$_2$F$_6$ (70) Si$_3$F$_8$ (30) | N$_2$ 5 × 10$^{-2}$ | Ar (30:70) | 115 | ◎ | ◎ |
| 19-19 | Si$_2$F$_6$ (70) Si$_3$F$_8$ (30) | N$_2$ 5 × 10$^{-2}$ | Ar (30:70) | 100 | ◎ | ◎ |
| 19-20 | Si$_2$F$_6$ (1) Si$_3$F$_8$ (99) | N$_2$ 5 × 10$^{-2}$ | Ar (30:70) | 120 | ◎ | ◎ |
| 19-21 | Si$_2$F$_6$ (65) Si$_3$F$_8$ (30) | N$_2$ 5 × 10$^{-2}$ | Ar (30:70) | 100 | ◎ | ◎ |

TABLE 20-continued

| Sample | Gases employed for formation of photoconductive layer | | | Deposition rate of film(Å/sec) | Repeatability by 3 sec.cycle | Image quality after standing 1 hr. at high temperature and humidity (35° C., 85% RH) |
|---|---|---|---|---|---|---|
| | Starting gases (relative flow amount value) | Nitrogen-containing substance (ratio to starting gases) | Atmospheric gas (flow amount relative to starting gases) | | | |
| 19-22 | $Si_4F_{10}$ (5) $SiF_4$ (1) $Si_2F_6$ (44) $Si_3F_8$ (55) | $NH_3$ 5 × $10^{-2}$ | Ar (30:70) | 95 | ◉ | ◉ |

EXAMPLE 20

An image-forming member for electrophotography was prepared according to the same procedure and under the same conditions as in Example 1 except for the conditions as shown in Table 21.

TABLE 21

| Conditions for forming photoconductive layer | | | |
|---|---|---|---|
| Gases employed | Flow amount or ratio | Discharging conditions | Layer thickness |
| (1) $B_2H_6(10)/Si_2H_6$ | 28 | 100 W | 28μ |
| (2) $SiH_4$ | 1 | | |
| (3) $SiF_4$ | 3 | | |
| (4) Ar | 68 | | |
| $O_2$ | 0.1 vol. % of [(1) + (2) + (3)] | | |

The thus prepared image-forming member for electrophotography was subjected to the image-forming treatment similarly as in Example 1 and a toner image was formed on a transfer paper, whereby there was obtained a very clear image.

EXAMPLE 21

After intermediate layers were formed on molybdenum substrates according to the same procedure and under the same conditions as in Example 20, photoconductive layers were formed on the intermediate layer according to the same procedure and under the same conditions as in Example 20 except that the Ar gas bomb 213 was replaced with gas bomb of Ar containing 0.2 vol.% of $O_2$ [hereinafter abridged as "$O_2(0.2)/Ar$"], the $O_2$ gas bomb 212 with $Si_2H_6$ gas bomb, and the $B_2H_6(10)/Si_2H_6$ gas bomb 209 with gas bomb of $Si_2H_6$ containing 100 vol. ppm of $B_2H_6$ [hereinafter abridged as "$B_2H_6(100)/Si_2H_6$"] and that the gases employed and the relative values of flow amounts were varied as shown in Table 22. When toner images were formed using the thus prepared image-forming members in a similar way to that in Example 20, better images were obtained in case of Sample A21 for the combination of corona charging effected at ⊖ 5.5 KV followed by imagewise exposure with ⊕ charged toner.

On the contrary, better toner images were obtained in case of Sample B21 for the combination of corona charging at ⊕ 6.0 KV followed by imagewise exposure with ⊖ charged toner.

TABLE 22

| Sample | Photoconductive layer | |
|---|---|---|
| | Gases employed for formation of photoconductive layer | Relative value of flow amount |
| A21 | $Si_2H_6$ | 28 |
| | $SiH_4$ | 1 |
| | $SiF_4$ | 3 |
| | Ar containing 0.2 vol. % $O_2$ | 68 |
| B21 | $Si_2H_6$ containing 100 vol. ppm $B_2H_6$ | 28 |
| | $SiH_4$ | 1 |
| | $SiF_4$ | 3 |
| | Ar containing 0.2 vol. % $O_2$ | 68 |

EXAMPLE 22

After intermediate layers were formed on molybdenum substrates according to the same procedure and under the same conditions as in Example 20, photoconductive layers were formed on the intermediate layers according to the same procedure and under the same conditions as in Example 20 except that the gases employed (using increased number of bombs in FIG. 2, if necessary) and the relative values of flow amounts were varied as shown in Table 23.

The thus prepared image-forming members were examined from both aspects of productivity (deposition rate) and characteristics (image quality at high temperatures under high humidity and repeatability). As the result, it was found that it is necessary for accomplishment of the object of the present invention to form a photoconductive layer with use of a starting gas mixture in which high order compounds with higher order than that of the minimum order compound with the minimum order of either n or m among those represented by the aforesaid formulas, (A) and (B), may be contained in amount of at least 1 vol.% based on said minimum order compound while controlling the value of flow amount of $O_2$ gas to 8 vol.% or lower based on the total flow amount of the starting gases represented by the above formulas. The standards for evaluation in Table 23 are the same as in Table 5.

TABLE 23

| Sample | Gases employed for formation of photoconductive layer | | | Deposition rate of film(Å/sec) | Repeatability by 3 sec.cycle | Image quality after standing 1 hr. at high temperature and humidity (35° C., 85% RH) |
|---|---|---|---|---|---|---|
| | Starting gases (relative flow amount value) | $O_2$ gas (value of $O_2$/ starting gases) | Atmospheric gas (flow amount relative to starting gases) | | | |
| 22-1 | $SiH_4$ (90) $Si_2H_6$ (0.5) $SiF_4$ (9.5) | 5 × $10^{-3}$ | Ar (30:70) | 15 | Δ | X |
| 22-2 | $SiH_4$ (90) $Si_2H_6$ (1) $SiF_4$ (9) | 5 × $10^{-3}$ | Ar (30:70) | 18 | Δ | Δ |
| 22-3 | $SiH_4$ (84) $Si_2H_6$ (5) $SiF_4$ (10) | 5 × $10^{-3}$ | Ar (30:70) | 25 | ○ | Δ |
| 22-4 | $SiH_4$ (20) | 5 × $10^{-3}$ | Ar | 60 | ◉ | ○ |

TABLE 23-continued

| Sample | Gases employed for formation of photoconductive layer | | | Deposition rate of film(Å/sec) | Repeatability by 3 sec.cycle | Image quality after standing 1 hr. at high temperature and humidity (35° C., 85% RH) |
|---|---|---|---|---|---|---|
| | Starting gases (relative flow amount value | $O_2$ gas (value of $O_2$/ starting gases) | Atmospheric gas (flow amount relative to starting gases) | | | |
| | $Si_2H_6$ (70) $SiF_4$ (10) | | (30:70) | | | |
| 22-5 | $SiH_4$ (5) $Si_2H_6$ (85) $SiF_4$ (10) | $5 \times 10^{-3}$ | Ar (30:70) | 80 | ◉ | ◉ |
| 22-6 | $SiH_4$ (5) $Si_2H_6$ (85) $SiF_4$ (10) | $5 \times 10^{-3}$ | — | 50 | ◉ | ◉ |
| 22-7 | $SiH_4$ (5) $Si_2H_6$ (85) $SiF_4$ (10) | $5 \times 10^{-3}$ | $H_2$ (30:70) | 70 | ◉ | ◉ |
| 22-8 | $SiH_4$ (5) $Si_2H_6$ (85) $SiF_4$ (10) | $5 \times 10^{-3}$ | Ar (30:70) | 60 | ◉ | ◉ |
| 22-9 | $Si_2H_6$ (60) $Si_3H_8$ (30) $SiF_4$ (10) | $10^{-1}$ | Ar (30:70) | 90 | ○ | X |
| 22-10 | $Si_2H_6$ (60) $Si_3H_8$ (30) $SiF_4$ (10) | $8 \times 10^{-2}$ | Ar (30:70) | 90 | ◉ | Δ |
| 22-11 | $Si_2H_6$ (60) $Si_3H_8$ (30) $SiF_4$ (10) | $10^{-2}$ | Ar (30:70) | 90 | ◉ | ◉ |
| 22-12 | $Si_2H_6$ (60) $Si_3H_8$ (30) $SiF_4$ (10) | $5 \times 10^{-3}$ | Ar (30:70) | 90 | ◉ | ◉ |
| 22-13 | $Si_2H_6$ (60) $Si_3H_8$ (30) $Si_2F_6$ (10) | $10^{-2}$ | Ar (30:70) | 100 | ◉ | ◉ |
| 22-14 | $SiF_4$ (5) $Si_2F_6$ (45) $Si_2H_6$ (50) | $10^{-2}$ | Ar (30:70) | 85 | ◉ | ◉ |
| 22-15 | $Si_2H_6$ (50) $Si_3H_8$ (25) $Si_4H_{10}$ (10) $Si_2F_6$ (15) | $10^{-2}$ | Ar (30:70) | 110 | ◉ | ◉ |
| 22-16 | $Si_2H_6$ (60) $Si_3H_8$ (30) $SiCl_4$ (10) | $10^{-2}$ | Ar (30:70) | 90 | ◉ | ◉ |
| 22-17 | $Si_2H_6$ (60) $Si_3H_8$ (30) $SiBr_4$ (10) | $10^{-2}$ | Ar (30:70) | 90 | ◉ | ◉ |
| 22-18 | $Si_2H_6$ (50) $Si_3H_8$ (25) $Si_4H_{10}$ (10) $SiF_4$ (15) | $10^{-2}$ | Ar (30:70) | 100 | ◉ | ◉ |

EXAMPLE 23

An image-forming member for electrophotography was prepared according to the same procedure and under the same conditions as in Example 1 except for the conditions as shown in Table 24.

TABLE 24

| Conditions for forming photoconductive layer | | | |
|---|---|---|---|
| Gases employed | Flow amount or ratio | Discharging conditions | Layer thickness |
| (1) $B_2H_6(10)/Si_2H_6$ | 28 | 100 W | 28μ |
| (2) $SiH_4$ | 1 | | |
| (3) $SiF_4$ | 3 | | |
| (4) Ar | 68 | | |
| $C_2H_4$ | 0.2 vol. % of [(1) + (2) + (3)] | | |

The thus prepared image-forming member for electrophotography was subjected to the image-forming treatment similarly as in Example 1 and a toner image was formed on a transfer paper, whereby there was obtained a very clear image.

EXAMPLE 24

After intermediate layers were formed on molybdenum substrates according to the same procedure and under the same conditions as in Example 23, photoconductive layers were formed on the intermediate layers according to the same procedure and under the same conditions as in Example 23 except that the Ar gas bomb 213 was replaced with gas bomb of Ar containing 0.3 vol.% of $C_2H_4$ [hereinafter abridged as "$C_2H_4(0.3)/Ar$"], the $C_2H_4$ gas bomb 212 with $Si_2H_6$ gas bomb, and the $B_2H_6(10)/Si_2H_6$ gas bomb 209 with $B_2H_6(100)/Si_2H_6$ gas bomb and that the gases employed and the relative values of flow amounts were varied as shown in Table 25. When toner images were formed using the thus prepared image-forming members similarly as in Example 23, better images were obtained in case of Sample A24 for the combination of corona charging effected at ⊖ 5.5 KV followed by imagewise exposure with ⊕ charged toner.

On the contrary, better toner images were obtained in case of Sample B24 for the combination of corona charging at ⊕ 6.0 KV followed by imagewise exposure with ⊖ charged toner.

TABLE 25

| | Photoconductive layer | |
|---|---|---|
| Sample | Gases employed for formation of photoconductive layer | Relative value of flow amount |
| A24 | $Si_2H_6$ | 28 |
| | $SiH_4$ | 1 |
| | $SiF_4$ | 3 |
| | Ar containing 0.3 vol. % $C_2H_4$ | 68 |
| B24 | $Si_2H_6$ containing 100 vol. ppm $B_2H_6$ | 28 |
| | $SiH_4$ | 1 |
| | $SiF_4$ | 3 |
| | Ar containing 0.3 vol. % $C_2H_4$ | 68 |

EXAMPLE 25

After intermediate layers were formed on molybdenum substrates according to the same procedure and under the same conditions as in Example 23, photoconductive layers were formed on the intermediate layers according to the same procedure and under the same conditions as in Example 23 except that the gases employed (using increased number of bombs in FIG. 2, if necessary) and the relative values of flow amounts were varied as shown in Table 26.

The thus prepared image-forming members were examined from both aspects of productivity (deposition rate) and characteristics (image quality at high temperatures under high humidity and repeatability). As the result, it was found that it is necessary for accomplishment of the object of the present invention to form a photoconductive layer with use of a starting gas mixture in which high order compounds with higher order than that of the minimum order compound with the minimum order of either n or m among those represented by the aforesaid formulas, (A) and (B), may be contained in an amount of at least 1 vol.% based on said minimum order compound while controlling the values of flow amounts of $CH_4$, $C_2H_4$, and $C_3H_8$ gases to 15 vol.% or lower based on the total flow amount of the starting gases represented by the above formulas. The standards for evaluation in Table 26 are the same as in Table 5.

TABLE 26

| | Gases employed for formation of photoconductive layer | | | | | Image quality after standing 1 hr. |
|---|---|---|---|---|---|---|
| Sample | Starting gases (relative flow amount value) | Carbon-containing substance (ratio to starting gases) | Atmospheric gas (flow amount relative to starting gases) | Deposition rate of film (Å/sec) | Repeatability by 3 sec.cycle | at high temperature and humidity (35° C., 85% RH) |
| 25-1 | $SiH_4$ (90) $Si_2H_6$ (0.5) $SiF_4$ (9.5) | $C_2H_4$ $7 \times 10^{-3}$ | Ar (30:70) | 15 | △ | X |
| 25-2 | $SiH_4$ (90) $Si_2H_6$ (1) $SiF_4$ (9) | $C_2H_4$ $7 \times 10^{-3}$ | Ar (30:70) | 18 | △ | △ |
| 25-3 | $SiH_4$ (84) $Si_2H_6$ (5) $SiF_4$ (11) | $C_2H_4$ $7 \times 10^{-3}$ | Ar (30:70) | 25 | ○ | △ |
| 25-4 | $SiH_4$ (20) $Si_2H_6$ (70) $SiF_4$ (10) | $C_2H_4$ $7 \times 10^{-3}$ | Ar (30:70) | 60 | ◉ | ○ |
| 25-5 | $SiH_4$ (5) $Si_2H_6$ (85) $SiF_4$ (10) | $C_2H_4$ $7 \times 10^{-3}$ | Ar (30:70) | 80 | | |
| 25-6 | $SiH_4$ (5) | $C_2H_4$ $7 \times 10^{-3}$ | — | 50 | ◉ | ◉ |
| 25-7 | $SiH_4$ (5) $Si_2H_6$ (85) $SiF_4$ (10) | $C_2H_4$ $7 \times 10^{-3}$ | $H_2$ (30:70) | 70 | ◉ | ◉ |
| 25-8 | $SiH_4$ (5) $Si_2H_6$ (85) $SiF_4$ (10) | $C_2H_4$ $7 \times 10^{-3}$ | He (30:70) | 60 | ◉ | ◉ |
| 25-9 | $Si_2H_6$ (60) $Si_3H_8$ (30) $SiF_4$ (10) | $C_2H_4$ $2 \times 10^{-1}$ | Ar (30:70) | 90 | ○ | X |
| 25-10 | $Si_2H_6$ (60) $Si_3H_8$ (30) $SiF_4$ (10) | $C_2H_4$ $1.5 \times 10^{-2}$ | Ar (30:70) | 90 | ◉ | △ |
| 25-11 | $Si_2H_6$ (60) $Si_3H_8$ (30) $SiF_4$ (10) | $C_2H_4$ $2 \times 10^{-2}$ | Ar (30:70) | 90 | ◉ | ◉ |
| 25-12 | $Si_2H_6$ (60) $SiF_4$ (10) | $C_2H_4$ $7 \times 10^{-3}$ (30:70) | Ar | 90 | ◉ | ◉ |
| 25-13 | $Si_2H_6$ (60) $Si_2F_6$ (10) | $C_2H_4$ $2 \times 10^{-2}$ (30:70) | Ar | 100 | ◉ | ◉ |
| 25-14 | $SiF_4$ (5) $Si_2F_6$ (45) $Si_2H_6$ (50) | $C_2H_4$ $2 \times 10^{-2}$ | Ar (30:70) | 85 | ◉ | ◉ |
| 25-15 | $Si_2H_6$ (50) $Si_3H_8$ (25) $Si_4H_{10}$ (10) $Si_2F_6$ (15) | $C_2H_4$ $2 \times 10^{-2}$ | Ar (30:70) | 110 | ◉ | ◉ |
| 25-16 | $Si_2H_6$ (60) $Si_3H_8$ (30) $SiCl_4$ (10) | $C_2H_4$ $2 \times 10^{-2}$ | Ar (30:70) | 90 | ◉ | ◉ |
| 25-17 | $Si_2H_6$ (60) $Si_3H_8$ (30) $SiBr_4$ (10) | $C_2H_4$ $2 \times 10^{-2}$ | Ar (30:70) | 90 | ◉ | ◉ |
| 25-18 | $Si_2H_6$ (50) | $C_2H_4$ $2 \times 10^{-2}$ | Ar | 100 | ◉ | ◉ |

TABLE 26-continued

| | Gases employed for formation of photoconductive layer | | | | | Image quality after standing 1 hr. |
|---|---|---|---|---|---|---|
| Sample | Starting gases (relative flow amount value) | Carbon-containing substance (ratio to starting gases) | Atmospheric gas (flow amount relative to starting gases) | Deposition rate of film (Å/sec) | Repeatability by 3 sec.cycle | at high temperature and humidity (35° C., 85% RH) |
| 25-19 | $Si_3H_8$ (25) $Si_4H_{10}$ (10) $SiF_4$ (15) $Si_2H_6$ (60) $Si_3H_8$ (30) $SiF_4$ (10) | $CH_4$ $1.5 \times 10^{-2}$ | Ar (30:70) (30:70) | 90 | ◉ | ◉ |
| 25-20 | $Si_2H_6$ (60) $Si_3H_8$ (30) $SiF_4$ (10) | $C_3H_8$ $5 \times 10^{-3}$ | Ar (30:70) | 90 | ◉ | ◉ |

EXAMPLE 26

An image-forming member for electrophotography was prepared according to the same procedure and under the same conditions as in Example 1 except for the conditions as shown in Table 27.

TABLE 27

| Conditions for forming photoconductive layer | | | |
|---|---|---|---|
| Gases employed | Flow amount or ratio | Discharging conditions | Layer thickness |
| (1) $B_2H_6(10)/Si_2H_6$ | 28 | 100 W | 28µ |
| (2) $SiH_4$ | 1 | | |
| (3) $SiF_4$ | 3 | | |
| (4) Ar | 68 | | |
| $N_2$ | 0.5 vol. % of [(1) + (2) + (3)] | | |

The thus prepared image-forming member for electrophotography was subjected to the image-forming treatment similarly as in Example 1 and a toner image was formed on a transfer paper, whereby there was obtained a very clear image.

EXAMPLE 27

After intermediate layers were formed on molybdenum substrates according to the same procedure and under the same conditions as in Example 26, photoconductive layers were formed on the intermediate layers according to the same procedure and under the same conditions as in Example 26 except that the Ar gas bomb 213 was replaced with gas bomb or Ar containing 0.4 vol.% of $N_2$ [hereinafter abridged as "$N_2(0.4)/Ar$"], the $N_2$ gas bomb 212 with $Si_2H_6$ gas bomb, and the $B_2H_6(10)/Si_2H_6$ gas bomb 209 with $B_2H_6(100)/Si_2H_6$ gas bomb and that the gases employed and the relative values of flow amounts were varied as shown in Table 28. When toner images were formed using the thus prepared image-forming members similarly as in Example 26, better images were obtained in case of Sample A27 for the combination of corona charging effected at ⊖ 5.5 KV followed by imagewise exposure with ⊕ charged toner.

On the contrary, better toner images were obtained in case of Sample B27 for the combination of corona charging at ⊕ 6.0 KV followed by imagewise exposure with ⊖ charged toner.

TABLE 28

| | Photoconductive layer | |
|---|---|---|
| Sample | Cases employed for formation of photoconductive layer | Relative value of flow amount |
| A27 | $Si_2H_6$ | 28 |
| | $SiH_4$ | 1 |
| | $SiF_4$ | 3 |
| | Ar containing 0.4 vol. % $N_2$ | 68 |
| B27 | $Si_2H_6$ containing 100 vol. ppm $B_2H_6$ | 28 |
| | $SiH_4$ | 1 |
| | $SiF_4$ | 3 |
| | Ar containing 0.4 vol. % $N_2$ | 68 |

EXAMPLE 28

After intermediate layers were formed on molybdenum substrates according to the same procedure and under the same conditions as in Example 26, photoconductive layers were formed on the intermediate layers according to the same procedure and under the same conditions as in Example 26 except that the gases employed (using increased number of bombs in FIG. 2, if necessary) and the relative values of flow amounts were varied as shown in Table 29.

The thus prepared image-forming members were examined from both aspects of productivity (deposition rate) and characteristics (image quality at high temperatures under high humidity and repeatability). As the result, it was found that it is necessary for accomplishment of the object of the present invention to form a photoconductive layer with use of a starting gas mixture in which high order compounds with higher order than that of the minimum order compound with the minimum order of either n or m among those represented by the aforesaid formulas, (A) and (B), may be contained in an amount of at least 1 vol.% based on said minimum order compound while controlling the value of flow amount of $N_2$ or $NH_3$ gas to 50 vol.% or lower based on the total flow amount of the starting gases represented by the above formulas. The standards for evaluation in Table 29 are the same as in Table 5.

TABLE 29

| | Gases employed for formation of photoconductive layer | | | | | Image quality after standing 1 hr. |
|---|---|---|---|---|---|---|
| Sample | Starting gases (relative flow amount value) | Nitrogen-containing substance (ratio to starting gases) | Atmospheric gas (flow amount relative to starting gases) | Deposition rate of film(Å/sec) | Repeatability by 3 sec.cycle | at high temperature and humidity (35° C., 35% RH) |
| 28-1 | $SiH_4$ (90) $Si_2H_6$ (0.5) $SiF_4$ (9.5) | $N_2$ $10^{-2}$ | Ar (30:70) | 15 | Δ | X |
| 28-2 | $SiH_4$ (90) | $N_2$ $10^{-2}$ | Ar | 18 | Δ | Δ |

TABLE 29-continued

| Sample | Gases employed for formation of photoconductive layer | | | Deposition rate of film(Å/sec) | Repeatability by 3 sec.cycle | Image quality after standing 1 hr. at high temperature and humidity (35° C., 35% RH) |
|---|---|---|---|---|---|---|
| | Starting gases (relative flow amount value) | Nitrogen-containing substance (ratio to starting gases) | Atmospheric gas (flow amount relative to starting gases) | | | |
| | Si$_2$H$_6$ (1) SiF$_4$ (9) | | (30:70) | | | |
| 28-3 | SiH$_4$ (84) Si$_2$H$_6$ (5) SiF$_4$ (11) | N$_2$ 10$^{-2}$ | Ar (30:70) | 25 | ○ | △ |
| 28-4 | SiH$_4$ (20) Si$_2$H$_6$ (70) SiF$_4$ (10) | N$_2$ 10$^{-2}$ | Ar (30:70) | 60 | ◉ | ○ |
| 28-5 | SiH$_4$ (5) Si$_2$H$_6$ (85) SiF$_4$ (10) | N$_2$ 10$^{-2}$ | Ar (30:70) | 80 | ◉ | ◉ |
| 28-6 | SiH$_4$ (5) Si$_2$H$_6$ (85) SiF$_4$ (10) | N$_2$ 10$^{-2}$ | — | 50 | ◉ | ◉ |
| 28-7 | SiH$_4$ (5) Si$_2$H$_6$ (85) SiF$_4$ (10) | N$_2$ 10$^{-2}$ | H$_2$ (30:70) | 70 | ◉ | ◉ |
| 28-8 | SiH$_4$ (5) Si$_2$H$_6$ (85) SiF$_4$ (10) | N$_2$ 10$^{-2}$ | He (30:70) | 60 | ◉ | ◉ |
| 28-9 | Si$_2$H$_6$ (60) Si$_3$H$_8$ (30) SiF$_4$ (10) | N$_2$ 8 × 10$^{-1}$ | Ar (30:70) | 90 | ○ | X |
| 28-10 | Si$_2$H$_6$ (60) Si$_3$H$_8$ (30) SiF$_4$ (10) | N$_2$ 5 × 10$^{-1}$ | Ar (30:70) | 90 | ◉ | △ |
| 28-11 | Si$_2$H$_6$ (60) Si$_3$H$_8$ (30) SiF$_4$ (10) | N$_2$ 5 × 10$^{-2}$ | Ar (30:70) | 90 | ◉ | ◉ |
| 28-12 | Si$_2$H$_6$ (60) Si$_3$H$_8$ (30) SiF$_4$ (10) | N$_2$ 5 × 10$^{-2}$ | Ar (30:70) | 90 | ◉ | ◉ |
| 28-13 | Si$_2$H$_6$ (60) Si$_3$H$_8$ (30) Si$_2$F$_6$ (10) | N$_2$ 5 × 10$^{-2}$ | Ar (30:70) | 100 | ◉ | ◉ |
| 28-14 | SiF$_4$ (5) Si$_2$F$_6$ (45) Si$_2$H$_6$ (50) | N$_2$ 5 × 10$^{-2}$ | Ar (30:70) | 85 | ◉ | ◉ |
| 28-15 | Si$_2$H$_6$ (50) Si$_3$H$_8$ (25) Si$_4$H$_{10}$ (10) Si$_2$F$_6$ (15) | N$_2$ 5 × 10$^{-2}$ | Ar (30:70) | 85 | ◉ | ◉ |
| 28-16 | Si$_2$H$_6$ (60) Si$_3$H$_8$ (30) SiCl$_4$ (10) | N$_2$ 5 × 10$^{-2}$ | Ar (30:70) | 90 | ◉ | ◉ |
| 28-17 | Si$_2$H$_6$ (60) Si$_3$H$_8$ (30) SiBr$_4$ (10) | N$_2$ 5 × 10$^{-2}$ | Ar (30:70) | 90 | ◉ | ◉ |
| 28-18 | Si$_2$H$_6$ (50) Si$_3$H$_8$ (25) Si$_4$H$_{10}$ (10) SiF$_4$ (15) | N$_2$ 5 × 10$^{-2}$ | Ar (30:70) | 100 | ◉ | ◉ |
| 28-19 | Si$_2$H$_6$ (60) Si$_3$H$_8$ (30) SiF$_4$ (10) | NH$_3$ 10$^{-2}$ | Ar (30:70) | 90 | ◉ | ◉ |

What we claim is:

1. A process for producing a photoconductive member, which comprises forming a photoconductive layer on a substrate for formation of a photoconductive layer by introducing starting substances for formation of a photoconductive layer under gaseous state into a deposition chamber maintained under a desired reduced pressure and exciting discharging under the gas atmosphere of said starting substances, characterized in that said starting substances are constituted of at least one substance selected from the first group consisting of substances(O) containing oxygen atoms as constituent atom, substances(N) containing nitrogen atoms as constituent atom and substances(C) containing carbon atoms as constituent atom, and at least two compounds selected from the second group consisting of the compounds of the formula:

$$Si_nH_{2n+2} \qquad (A)$$

wherein n is a positive integer and the compounds of the formula:

$$Si_mH_lX_k \qquad (B)$$

wherein m and k are positive integers, l is 0 or a positive integer, l+k=2m+2, and X represents a halogen atom, n and m being called "order number" hereinafter, and said at least two compounds selected from the second group consisting of the compounds represented by the formulas (A) and (B) to be introduced into said deposition chamber being controlled in amounts such that the proportion of the total of high order compounds is at least 1 vol.% based on the total of the minimum order compounds, the minimum order compound being one whose order number is the minimum among order numbers of said at least two compounds, the high order compound being one whose order number is higher than the order number of the minimum order compound wherein at least 0.1 vol.% of (O), (N), or (C) based on compounds selected from (A) and (B).

2. A process according to claim 1 wherein the compounds represented by the formula (A) are selected from the group consisting of $SiH_4$, $Si_2H_6$, $Si_3H_8$, $Si_4H_{10}$, $Si_5H_{12}$, $Si_6H_{14}$, $Si_7H_{16}$, and $Si_8H_{18}$.

3. A process according to claim 1 wherein the compounds represented by the formula (B) are selected from the group consisting of $SiX_4$, $Si_2X_6$, $Si_3X_8$, $SiHX_3$, $SiH_2X_2$, and $SiH_3X$ (wherein X is F, Cl, Br, I).

4. A process according to claim 1 wherein the high order compound with higher order number of m is at least one compound selected from the group consisting of $Si_2H_6$, $Si_3H_8$, $Si_4H_{10}$, $Si_2F_6$, $Si_2Cl_6$, and $Si_2Br_6$.

5. A process according to claim 1 wherein the starting substances further contain a starting material for incorporation of an impurity which controls the conduction type of the photoconductive layer formed.

6. A process according to claim 5 wherein the impurity is n-type impurity.

7. A process according to claim 5 wherein the impurity is a p-type impurity.

8. A process according to claim 5 wherein the starting material is at least one selected from the group consisting of $PH_3$, $P_2H_4$, $PF_3$, $PF_5$, $PCl_3$, $AsH_3$, $AsF_3$, $AsF_5$, $AsCl_3$, $SbH_3$, $SbF_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, and $AlCl_3$.

9. A process according to claim 1 wherein the starting substances contain at least two kinds of compounds selected from the group of compounds represented by the formula (A).

10. A process according to claim 1 wherein the starting substances contain at least two kinds of compounds selected from the group of compounds represented by the formula (B).

11. A process according to claim 1 wherein the starting substances contain at least two kinds of compounds selected from the group of compounds represented by the formula (A) and at least one kind of compound selected from the group of compounds represented by the formula (B).

12. A process according to claim 1 wherein the starting substances contain at least one kind of compound selected from the group of compounds represented by the formula (A) and at least two kinds of compounds selected from the group of compounds represented by the formula (B).

13. A process according to claim 1 wherein the first group of substances consists of $O_2$, $O_3$, $H_3SiOSiH_3$, $H_3SiOSiH_2OSiH_3$, $N_2$, $NH_3$, $H_2NNH_2$, $HN_3$, $NH_4N_3$, $F_3N$, $F_4N_2$, $NO$, $NO_2$, $N_2O$, $N_2O_3$, $N_2O_4$, $N_2O_5$ and $NO_3$, $CO$, $CO_2$, saturates hydrocarbons, ethylenic hydrocarbons, acetylenic hydrocarbons, alkyl silanes, halogen-substituted paraffinic hydrocarbons, and halogen-containing alkyl silanes.

14. A photoconductive member, having a substrate for a photoconductive member and a photoconductive layer provided on said substrate, characterized in that said photoconductive layer comprises an amorphous silicon formed by discharge decomposition of gaseous starting substances containing at least one substance selected from the first group consisting of substances containing oxygen atoms as constituent atom, substances containing nitrogen atoms as constituent atom and substances containing carbon atoms as constituent atom, and at least two compounds selected from the second group consisting of the compounds of the formula:

$$Si_nH_{2n+2} \quad (A)$$

wherein n is a positive integer and the compounds of the formula:

$$Si_mH_lX_k \quad (B)$$

wherein m and k are positive integers, l is 0 or a positive integer, $l+k=2m+2$, and X represents a halogen atom, n and m being called "order number" hereinafter, and said at least two compounds selected from the second group consisting of the compounds represented by the formulas (A) and (B) being controlled in amounts such that the proportion of the total of high order compounds is at least 1 vol.% based on the total of the minimum order compounds, the minimum order compound being one whose order number is the minimum among order numbers of said at least two compounds, the high order compound being one whose order number is higher than the order number of the minimum order compound wherein at least 0.1 vol.% of (O), (N), or (C) based on compounds selected from (A) and (B).

15. A photoconductive member according to claim 14 wherein there is further provided in intermediate layer between the substrate and the photoconductive layer.

16. A photoconductive member according to claim 14 wherein the intermediate layer is a barrier layer.

17. A photoconductive member according to claim 14 wherein the intermediate layer has a thickness of 30 Å to $2\mu$.

18. A photoconductive member according to claim 14 wherein the photoconductive layer contains hydrogen atoms in an amount of 1 to 40 atomic %.

19. A photoconductive member according to claim 14 wherein the photoconductive layer contains halogen atoms in an amount of 1 to 40 atomic %.

20. A photoconductive member according to claim 14 wherein the photoconductive layer contains hydrogen atoms and halogen atoms in an amount of 1 to 40 atomic % as the total content.

* * * * *

UNITED STATES PATENT AND TRADEMARK OFFICE
CERTIFICATE OF CORRECTION

PATENT NO. : 4,468,443
DATED : August 28, 1984
INVENTOR(S) : Shimizu et al.

Page 1 of 4

It is certified that error appears in the above-identified patent and that said Letters Patent is hereby corrected as shown below:

IN THE ABSTRACT:

lines 21 and 22, change "1" to --$\ell$--.

IN THE SPECIFICATION:

Column 2, line 51, change ", the" to --. The--.

Column 5, line 35, change "substance" to --substances--.

Column 8, line 42, in Table 3 under column heading "A17", (Compound $Si_2Br_6$), insert --⊖--.

Column 14, line 28, change "amoutns" to --amounts--.

line 65, change "humifity" to --humidity--.

Column 17, lines 23 and 24, (Table 6) delete "150W 16u" add --150W 16u-- after "1" (for $SiF_4$).

line 48, change "ontained" to --obtained--.

Column 19, lines 59 and 60, (Table 9) delete "100W 18u" insert after "1" --100W 18u-- ($SiH_4$).

Column 23, lines 37 and 38, (Table 12) after "30" delete "150W 16u", insert --150W 16u-- after "1".

Column 25, Table 14 (Sample 13-6) change "($7 \times 10^{10-2}$)" to --($7 \times 10^{-2}$)--.

UNITED STATES PATENT AND TRADEMARK OFFICE
CERTIFICATE OF CORRECTION

PATENT NO. : 4,468,443
DATED : August 28, 1984
INVENTOR(S) : Shimizu et al.

Page 2 of 4

It is certified that error appears in the above-identified patent and that said Letters Patent is hereby corrected as shown below:

Column 25, Table 14 (Sample 13-16) delete "(30:70)" and insert --(30:70)-- under "AR".

Column 25, Table 14 (Sample 3-18), change "$C_2H_4 2x^{-2}$" to --$C_2H_4 2x10^{-2}$--.

Column 25, Table 14 (Sample 13-22) change "$CH_4$" to --$C_2H_4$--.

Column 27, lines 6 and 7, (Table 15) delete "100W 18 u" insert after "1" --100w 18u--.

Column 28, (Table 17 line 16-7) insert --O-- under "Repeatability column".

Column 29, lines 50 and 51, (Table 18) after "30" delete "150W 16u", and insert --150W 16u-- after "1".

Column 34, lines 22 and 23, (Table 22) delete "$B_{21}$" and insert --$B_{21}$-- under "Sample" column.

Column 38, Table 26, (Sample 25-5) in last two columns insert --⊚-- and --⊚-- respectively.

UNITED STATES PATENT AND TRADEMARK OFFICE
CERTIFICATE OF CORRECTION

PATENT NO. : 4,468,443
DATED : August 28, 1984
INVENTOR(S) : Shimizu et al.

Page 3 of 4

It is certified that error appears in the above-identified patent and that said Letters Patent is hereby corrected as shown below:

Column 38, Table 26 (Sample 25-6) "Starting gases column" under "Si $H_4$(5)" add --$SiH_6$(85) $SiF_4$ (10)--.

Column 37, Table 26 (Sample 25-12) second column under "$Si_2H_6$(60) insert --$Si_3H_8$(30)--.

Table 26 (Sample 25-12, 3rd column) delete (30:70).

Table 26 (Sample 25-12, 4th column under "Ar") insert --(30:70)--.

Table 26 (Sample 25-13, 2d column) under "$Si_2H_6$(60)" insert --$Si_3H_8$(30)--.

Table 26 (Sample 25-13, 3rd column) delete "(30:70)".

UNITED STATES PATENT AND TRADEMARK OFFICE
CERTIFICATE OF CORRECTION

PATENT NO. : 4,468,443

DATED : August 28, 1984

INVENTOR(S) : Shimizu et al.

Page 4 of 4

It is certified that error appears in the above-identified patent and that said Letters Patent is hereby corrected as shown below:

Table 26 (Sample 25-13, 4th column) under "Ar" insert --(30:70)--.

Signed and Sealed this

Fifth Day of November 1985

[SEAL]

Attest:

Attesting Officer

DONALD J. QUIGG

Commissioner of Patents and Trademarks